United States Patent
Link et al.

(10) Patent No.: US 11,552,008 B2
(45) Date of Patent: Jan. 10, 2023

(54) ASYMMETRIC CORED INTEGRATED CIRCUIT PACKAGE SUPPORTS

(71) Applicant: Intel Corporation, Santa Clara, CA (US)

(72) Inventors: Lauren Ashley Link, Mesa, AZ (US); Andrew James Brown, Phoenix, AZ (US); Prithwish Chatterjee, Tempe, AZ (US); Sai Vadlamani, Chandler, AZ (US); Ying Wang, Chandler, AZ (US); Chong Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 897 days.

(21) Appl. No.: 16/202,690

(22) Filed: Nov. 28, 2018

(65) Prior Publication Data

US 2020/0168536 A1    May 28, 2020

(51) Int. Cl.
  *H01L 23/498*    (2006.01)
  *H01L 23/64*     (2006.01)
  *H01L 23/15*     (2006.01)

(52) U.S. Cl.
  CPC ........ *H01L 23/49822* (2013.01); *H01L 23/15* (2013.01); *H01L 23/645* (2013.01)

(58) Field of Classification Search
  CPC . H01L 23/49822; H01L 23/15; H01L 23/645; H01L 24/13; H01L 24/16; H01L 24/17; H01L 2224/16145; H01L 2924/15311; H01L 25/071; H01L 25/18; H01L 25/50; H01L 2224/16225; H01L 2924/181; H01L 21/4857; H01L 23/49816; H01L 2224/16227; H01L 2224/17181; H01L 23/49827; H05K 3/0097; H05K 3/4682; H05K 2203/1536
  USPC .......................................... 257/668
  See application file for complete search history.

(56) References Cited

U.S. PATENT DOCUMENTS

| | | | | |
|---|---|---|---|---|
| 6,388,207 | B1* | 5/2002 | Figueroa ................ | H05K 1/115 257/E23.079 |
| 9,515,003 | B1* | 12/2016 | Fitzgerald ........... | H01L 23/3677 |
| 10,123,418 | B1* | 11/2018 | Lin ....................... | H05K 1/0298 |
| 2006/0170527 | A1* | 8/2006 | Braunisch ............. | H01F 41/046 257/E23.07 |
| 2014/0159850 | A1* | 6/2014 | Roy ..................... | H01F 17/0013 336/200 |
| 2016/0233292 | A1* | 8/2016 | Chen ...................... | H01L 28/10 |
| 2017/0084554 | A1* | 3/2017 | Dogiamis ......... | H01L 23/49838 |

FOREIGN PATENT DOCUMENTS

KR    20160095487    *    8/2016

* cited by examiner

*Primary Examiner* — Duy T Nguyen
(74) *Attorney, Agent, or Firm* — Akona IP PC

(57) ABSTRACT

Disclosed herein are asymmetric cored integrated circuit (IC) package supports, and related devices and methods. For example, in some embodiments, an IC package support may include a core region having a first face and an opposing second face, a first buildup region at the first face of the core region, and a second buildup region at the second face of the core region. A thickness of the first buildup region may be different than a thickness of the second buildup region. In some embodiments, an inductor may be included in the core region.

24 Claims, 16 Drawing Sheets

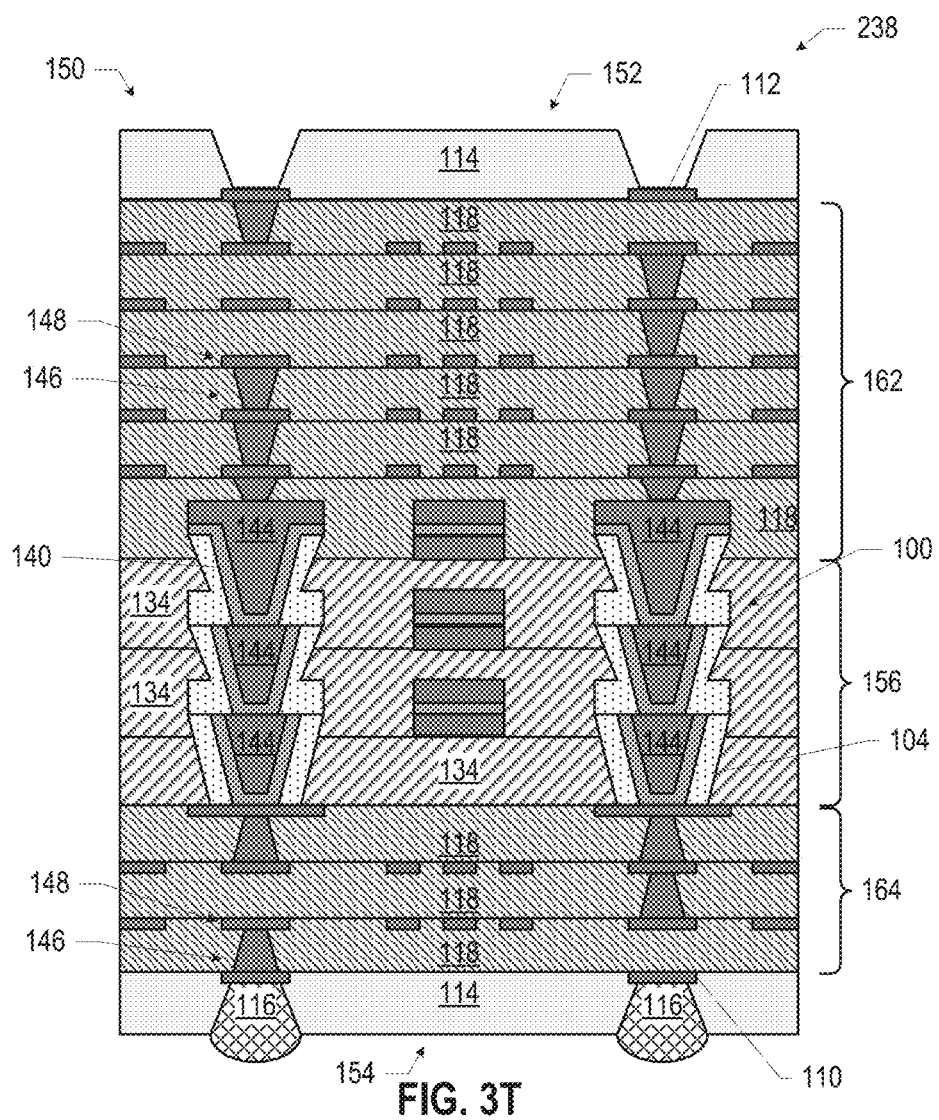

ASYMMETRIC CORED INTEGRATED CIRCUIT PACKAGE SUPPORTS

BACKGROUND

Integrated circuit (IC) packages may include a package support, such as a package substrate or interposer, to which IC dies are coupled. Some IC packages may include an inductor (e.g., for use in integrated voltage regulators or radio frequency communication circuitry). Inductors having adequate electrical performance are typically large, taking up valuable volume in an IC package.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
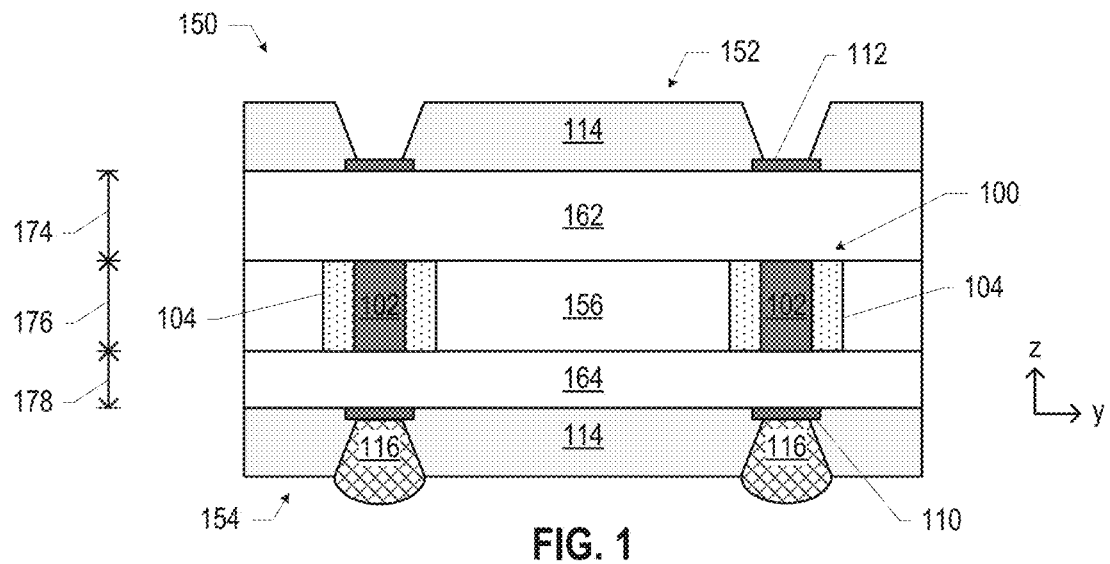
FIG. 1 is a cross-sectional view of an asymmetric cored integrated circuit (IC) package support, in accordance with various embodiments.

Disclosed herein are asymmetric cored integrated circuit (IC) package supports, and related devices and methods. For example, in some embodiments, an IC package support may include a core region having a first face and an opposing second face, a first buildup region at the first face of the core region, and a second buildup region at the second face of the core region. A thickness of the first buildup region may be different than a thickness of the second buildup region. In some embodiments, an inductor may be included in the core region.

The miniaturization of computing and communication devices is conventionally limited by constraints on achievable size, power consumption, noise levels, manufacturability, and high frequency operation. For example, IC packages typically include a die mounted to a package substrate. The package substrate may need to provide a large number of electrical pathways proximate to the die, and thus many buildup layers may be needed to accommodate these pathways. When the substrate is a cored substrate (in which buildup layers are formed on both faces of a core), the need for high density pathways proximate to the die (on the "front side" of the substrate) typically requires many buildup layers between the core and the die. However, since many manufacturing tools typically require a cored substrate to have the same number of buildup layers on either face of the core (resulting in a "symmetric" package substrate), a substrate having many buildup layers on one side of the core must also have many buildup layers on the other side of the core. Thus, conventional package substrates with many buildup layers to provide high front side pathway density must also include many buildup layers on the back side of the substrate, regardless of the pathway density requirements on the back side. In many package substrates, the back side buildup layers may be underutilized because of lower pathway density requirements, and thus these buildup layers may undesirably increase the z-height of the package substrate without providing a performance benefit. Further, conventional cored package substrates have not readily accommodated a magnetic inductor in the core, and thus may not be adequate to meet the power delivery requirements of future generations of devices.

The cored IC package supports disclosed herein may exhibit improved performance with a smaller form factor and/or smaller z-height relative to conventional approaches. The embodiments disclosed herein may be asymmetric, having different numbers of buildup layers on either face of a core, enabling the number of buildup layers to be more appropriately matched to the required pathway density, and thus reducing the z-height of the IC package supports relative to conventional approaches. Reductions in z-height may both improve the versatility of the IC package supports disclosed herein, and may also improve performance by reducing the distance between the die coupled to the front side of the IC package and any other components (e.g., capacitors) coupled to the back side of the IC package support. The inductors disclosed herein may be utilized as integrated voltage regulators (IVRs) and/or in power storage devices, for example, and may exhibit improved inductance and Q values than conventional inductors. The IC package supports and inductors disclosed herein may be utilized in any appropriate setting; for example, the IC package supports and inductors disclosed herein may be advantageously utilized in reduced form factor settings, such as mobile applications, wearable devices, Internet of Things (IoT), server devices, etc.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 3" may be used to refer to the collection of drawings of FIGS. 3A-3T, and the phrase "FIG. 5" may be used to refer to the collection of drawings of FIGS. 5A-5G. As used herein, an "IC package support" or "package support" may refer to a structure included in an IC package that provides mechanical and/or electrical support to one or more dies or other electrical components (e.g., passive or active components) included in the IC package. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

FIG. 1 is a cross-sectional view of a portion of an asymmetric cored IC package support 150. The IC package support 150 of FIG. 1 (and others of the accompanying figures) are illustrated as including an inductor 100, but any of the IC package supports 150 may not include an inductor 100. Although only a portion of a single inductor 100 is illustrated in various ones of the accompanying drawings of IC package supports 150, this is simply for ease of illustration, and any of the IC package supports 150 disclosed herein may include any desired number and arrangement of inductors 100 (which may themselves take the form of any of the embodiments of the inductors 100 disclosed herein). As discussed further below, the inductors 100 may be at least partially disposed in the core region 156 of an IC package support 150, and portions of an inductor 100 (e.g., portions of a solenoid 102) may also be included in areas outside the core region 156 (e.g., in the first buildup region 162 and/or the second buildup region 164). In some embodiments, the IC package support 150 may be a package substrate (e.g., the package substrate 1652 discussed below with reference to FIG. 8) or an interposer (e.g., the interposer 1657 discussed below with reference to FIG. 8).

The IC package support 150 of FIG. 1 may include a first face 152 and an opposing second face 154. Conductive contacts 112 may be exposed at the first face 152 between regions of solder resist material 114. The conductive contacts 112 may have a surface finish material thereon (e.g., including silver and/or gold); this surface finish material may mitigate oxidation of the conductive contacts 112 and improve adhesion between the conductive contacts 112 and a solder (not shown) used to attach an electronic component (e.g., a die) to the conductive contacts 112 (e.g., as discussed below with reference to FIG. 11). In some embodiments, the solder that couples to the conductive contacts 112 may provide first-level interconnects between the IC package support 150 and a die or other component (not shown). Solder balls 116 (e.g., micro balls) may be coupled to conductive contacts 110 at the second face 154 between regions of solder resist material 114. In some embodiments, the solder balls 116 may provide second-level interconnects between the IC package support 150 and a circuit board or another IC package (not shown, but discussed below with reference to FIG. 8). Additional components may be coupled to the IC package support (e.g., one or more IC dies at the first face 152 and one or more land-side capacitors (LSCs) at the second face 154).

The IC package support 150 may include a first buildup region 162, a second buildup region 164, and a core region 156 between the first buildup region 162 and the second buildup region 164. The core region 156 may impart advantageous mechanical, thermal, and/or electrical properties to the IC package support 150. The core region 156, the first buildup region 162, and the second buildup region 164 may each include one or more layers of dielectric material and may have conductive structures (e.g., conductive vias, pads, and/or lines) therein. The dielectric material included in the core region 156 may differ from the dielectric material used in the buildup regions 162/164. For example, the core region 156 may include a dielectric material 134 (discussed below) that is a prepreg fiber glass material (e.g., a glass cloth-reinforced epoxy resin), while the buildup regions 162/164 may include a dielectric material 118 (discussed below) that is a resin material (e.g., an epoxy resin film having filler particles therein). In some embodiments, the dielectric material 134 included in the core region 156 may have a lower coefficient of thermal expansion (CTE) than the CTE of the dielectric material 118 included in the buildup regions 162/164. In some embodiments, the dielectric material 134 included in the core region 156 may have a higher Young's modulus (and may therefore be stiffer) than the dielectric material 118 included in the buildup regions 162/164.

The thickness 174 of the first buildup region 162 may be different from the thickness 178 of the second buildup region 164, and thus the IC package support 150 may be "asymmetric" in that the buildup region at one face of the core region 156 is thicker than the buildup region at the other face of the core region 156. In particular, the thickness 174 may be greater than the thickness 178. In some embodiments, the number of layers of dielectric material 118 included in the first buildup region 162 may be greater than the number of layers of dielectric material 118 included in the second buildup region 164. For example, the first buildup region 162 may include more than two layers (e.g., 4, 5, 6, 7, 8, or 9 layers) while the second buildup region 164 may include 2 or fewer layers. In some examples of the IC package supports 150 disclosed herein, the first buildup region 162 may include 9 layers while the second buildup region 164 may include 2 layers; in some other examples of the IC package supports 150 disclosed herein, the first buildup region 162 may include 8 layers while the second buildup region 164 may include one layer. The core region 156 may include one or more layers of the dielectric material 135 (e.g., between 2 layers and 10 layers). In some embodiments, the thickness 176 of the core region 156 may be between 100 microns and 1000 microns.

Figure 2:
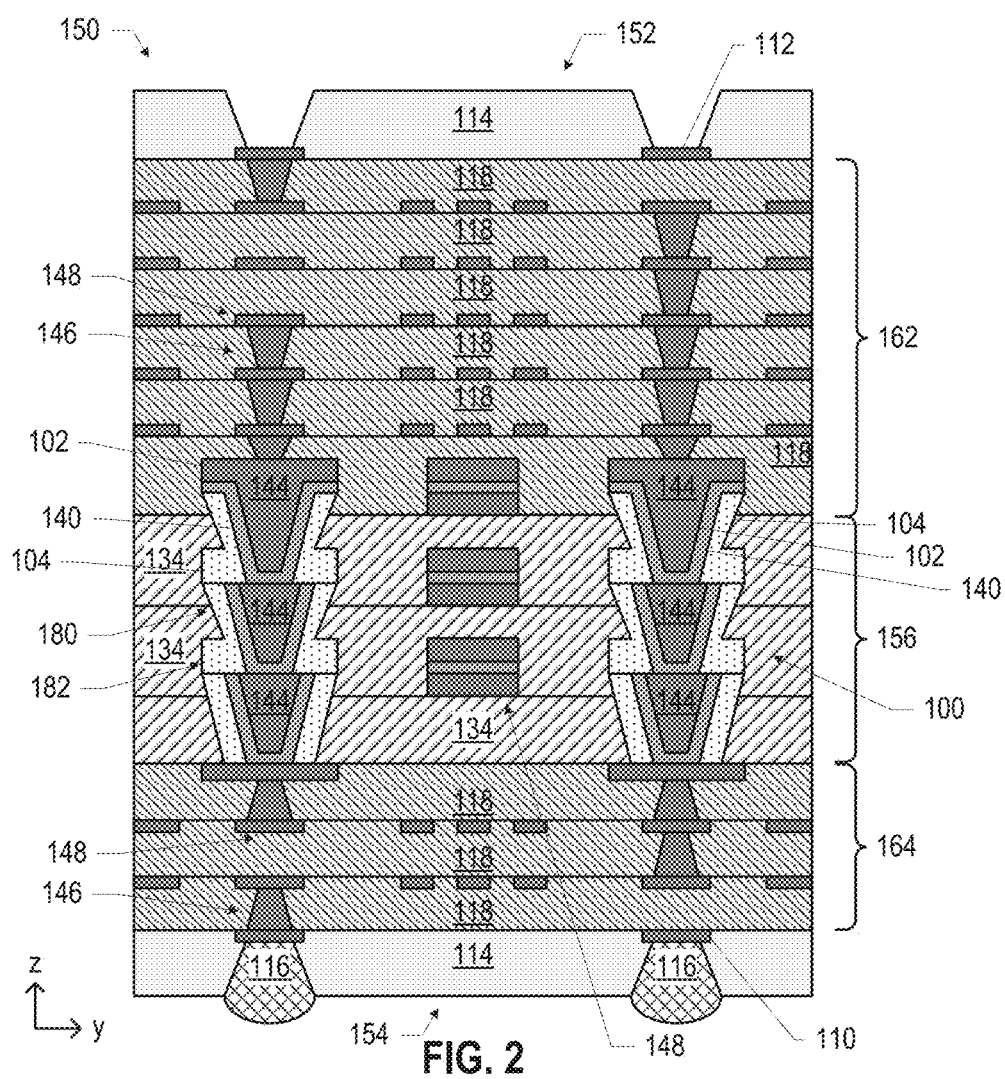
FIG. 2 is a cross-sectional view of an example asymmetric cored IC package support, in accordance with various embodiments.
Figure 4:
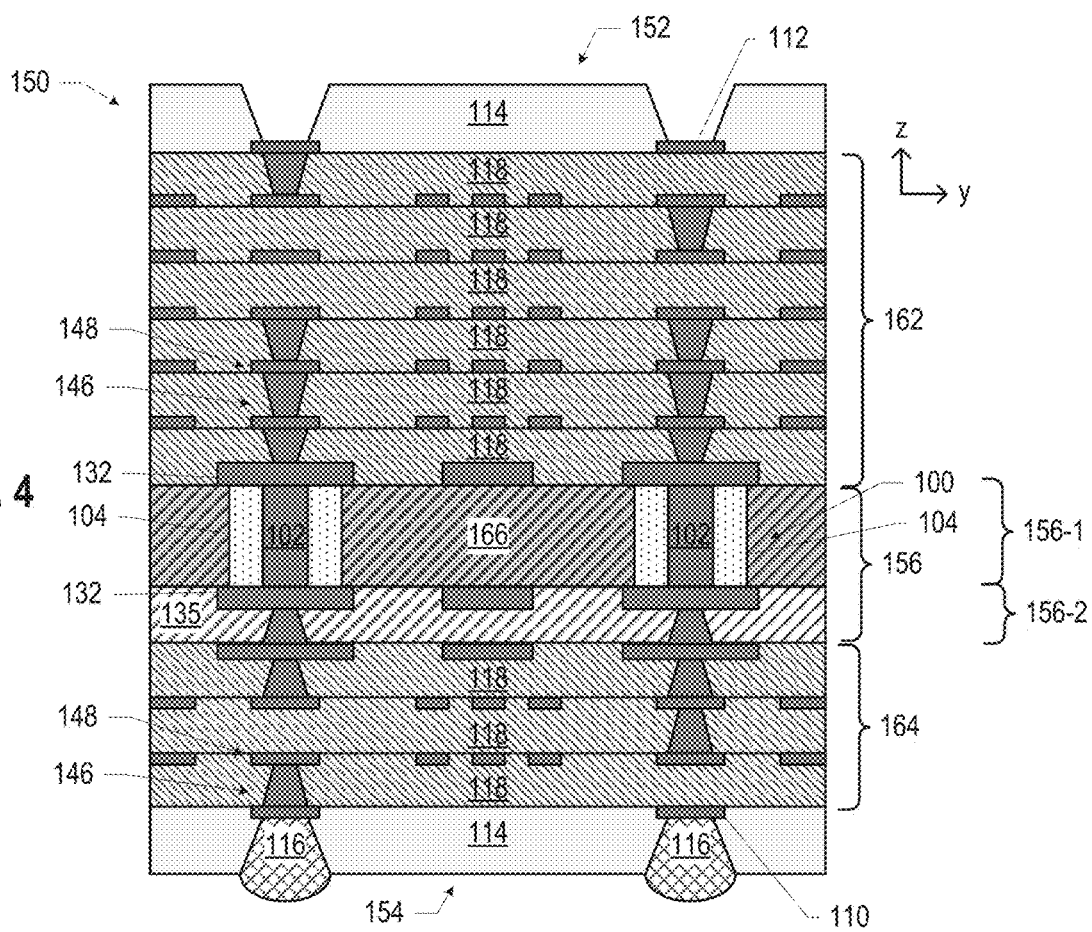
FIG. 4 is a cross-sectional view of another example asymmeric cored IC package support, in accordance with various embodiments.

As noted above, one or more inductors 100 may be included in the core region 156 (while in other embodiments, an IC package support 150 may not include an inductor 100). An inductor 100 may include a solenoid 102 and a magnetic material 104. The solenoid 102 may be formed of conductive lines/pads 148 and/or conductive vias 146 arranged to form a spiral-type shape (e.g., a rectangular spiral) through the dielectric material 135. Particular examples of inductors 100 in core regions 156 are illustrated in FIGS. 2 and 4, and discussed below. In some embodiments, the conductive vias 146 of a solenoid 102 may be formed with a high aspect ratio (e.g., a height-to-width ratio greater than or equal to 2:1), which may reduce the stray capacitance and increase the inductance of the inductor 100. The solenoid 102 may have a longitudinal axis through the volume in the interior of the solenoid 102 that is oriented in the z-direction, perpendicular to the first face 152 and to the second face 154. Any suitable material may be used in the solenoid 102 (and the conductive lines/pads 148 and conductive vias 146) disclosed herein, such as a metal (e.g., copper).

The magnetic material 104 may include portions in the interior of the solenoid 102 and/or portions exterior to the solenoid 102. Various ones of the accompanying figures illustrate embodiments in which the magnetic material 104 substantially surrounds the conductive vias 146 of the solenoid 102 (see, e.g., FIGS. 2 and 4). The magnetic material 104 may have any suitable composition. For example, the magnetic material 104 may include cobalt, iron, or nickel. In some embodiments, the magnetic material 104 may include iron and cobalt (e.g., in the form of an iron-cobalt-based ferromagnetic alloy powder). In some embodiments, the magnetic material 104 may include iron and nickel (e.g., in the form of an iron-nickel-based ferromagnetic alloy powder). In some embodiments, the magnetic material 104 may include flakes of a magnetic material (e.g., flakes of cobalt iron oxide, cobalt-nickel-iron alloys, nickel-iron-molybdenum alloys, and/or nickel-iron alloys). Such alloys may have a narrow hysteresis loop with low coercive magnetic field, which may have low hysteresis loss and thus may be desirable for inductor applications. The magnetic material 104 may also include carrier polymers (e.g., epoxy resins or polyimides) and an organic solvent; when applied (e.g., as discussed below with reference to FIG. 3D), the magnetic material 104 may be a slurry that may be cured during manufacturing. For example, iron-cobalt and iron-nickel alloys may have a relative permeability greater than 1000 at low frequencies (e.g., DC operation), and when composited with bonding materials (such as the carrier polymers and solvents discussed above) to allow for high frequency operation (e.g., greater than 100 megahertz), the magnetic material 104 may exhibit a relative permeability on the order of 10.

FIG. 2 illustrates an example IC package support 150 that is a particular embodiment of the IC package support 150 of FIG. 1. In particular, the IC package support 150 of FIG. 2 includes a core region 156 having an inductor 100 therein, a first buildup region 162, and a second buildup region 164. The thickness of the first buildup region 162 of the IC package support 150 of FIG. 2 is greater than the thickness of the second buildup region 164. A number of elements of FIG. 2 are shared with subsequent figures; for ease of discussion, a description of these elements is not repeated, and these elements may take the form of any of the embodiments disclosed herein.

In the IC package support 150 of FIG. 2 (and the other IC package supports 150 disclosed herein), conductive structures, including conductive lines/pads 148 and conductive vias 146 may be arranged through the dielectric material 118 of the buildup regions 162/164, and the dielectric material 134 of the core region 156, to provide conductive pathways between the first face 152 and the second face 154, between different locations at the first face 152, between different locations at the second face 154, or between the inductor 100 and either of the faces 152/154 (or other components embedded in the IC package supports 150, not shown). The particular arrangement of conductive lines/pads 148 and conductive vias 146 depicted in FIG. 2 (and others of the accompanying figures) is simply illustrative, and an IC package support 150 may include any suitable arrangement. In some embodiments, the thickness of a layer of the dielectric material 118 (in the z-direction) may be between 30 microns and 40 microns. In some embodiments, the thickness of a conductive line/pad 148 (in the z-direction) in a buildup region 162/164 may be between 10 microns and 15 microns. In some embodiments, the height of a conductive via 146 (in the z-direction) in a buildup region 162/164 may be between 20 microns and 25 microns. In some embodiments, the thickness of a layer of the dielectric material 135 (in the z-direction) may be between 15 microns and 300 microns. In some embodiments, the thickness of a conductive line/pad 148 (in the z-direction) in the core region 156 may be between 20 microns and 35 microns. In some embodiments, the thickness of a conductive via 146 (in the z-direction) in the core region 156 may be between 15 microns and 300 microns.

The inductor 100 of FIG. 2 includes a solenoid 102 that includes vertical portions formed of stacks of conductive vias 146 through various layers of the dielectric material 134. The magnetic material 104 may laterally surround these conductive vias 146. In particular, in some layers of the dielectric material 134, the magnetic material 104 may have a V-shaped portion 180 whose cross-section has a similar shape to the shape of the top portion of the associated conductive via 146 in the layer of the dielectric material 134, and a foot portion 182 that extends laterally outward proximate to the bottom portion of the associated conductive via 146. Some layers of the dielectric material 134 may include magnetic material 104 that does not have a foot portion 182 (see, e.g., the "bottommost" portions of the magnetic material 104 in FIG. 2).

The core region 156 may include other structures in addition to the inductor 100; for example, FIG. 2 illustrates conductive lines 148 (including portions of metal foil 132, discussed below) in the core region 156.

Figure 3A:
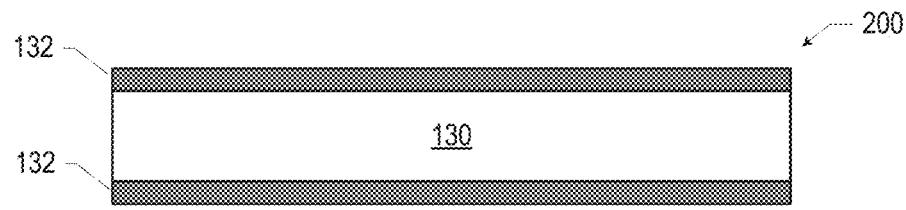
FIGS. 3A-3T illustrate stages in an example process of manufacturing the asymmetric cored IC package support of FIG. 2, in accordance with various embodiments.

The IC package support 150 of FIG. 2 may be manufactured using any suitable techniques. For example, FIGS. 3A-3T illustrate stages in an example process for manufacturing the IC package support 150 of FIG. 2. Conventional manufacturing equipment used in the fabrication of electronic device components (e.g., package substrates) typically performs operations on both faces of an object simultaneously (e.g., applying dielectric material to both opposing faces of an object, such as a substrate, core, or a temporary support), and thus outputs "symmetric" components. Asymmetric IC package supports, like the IC package supports 150 disclosed herein, have thus not been conventionally considered to be manufacturable. The fabrication techniques disclosed herein, however, overcome these conventional limitations, and may utilize conventional machinery to fabricate unconventional, asymmetric components. For example, the operations discussed below with reference to FIGS. 3A-3Q and 3S-3T may be performed by tooling that operates on both opposing faces of an object; as such tooling is commonly available, the asymmetric IC package supports 150 fabricated in accordance with the method of FIG. 3 may be efficiently manufactured.

FIG. 3A is a side, cross-sectional view of an assembly 200 including a temporary support 130 having layers of metal foil 132 (e.g., copper foil) at either face. The temporary support 130 may include any suitably rigid and flat material on which subsequent manufacturing operations may be performed. In some embodiments, the temporary support 130 may include any of the materials discussed herein with reference to the dielectric material 134.

Figure 3B:
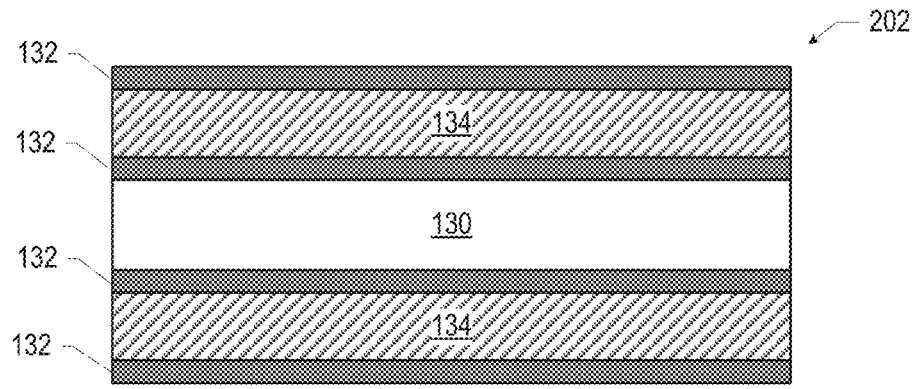

FIG. 3B is a side, cross-sectional view of an assembly 202 subsequent to attaching a layer of dielectric material 134 and an additional layer of metal foil 132 on the layers of metal foil 132 of the assembly 200 (FIG. 3A). In some embodiments, the layer of dielectric material 134 secured to either face of the assembly 200 may include one or more individual sheets of the dielectric material 134 (e.g., two sheets of a prepreg glass fiber material, each having a thickness of 100 microns, may be attached together to form a layer of dielectric material 134 that is 200 microns thick). The layers of dielectric material 134, and the additional layers of metal foil 132, may be attached using any suitable technique, such as a hot pressing technique.

Figure 3C:
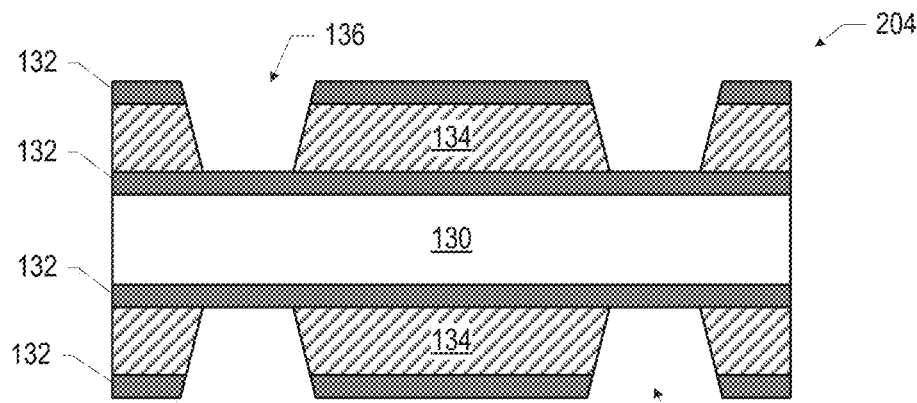

FIG. 3C is a side, cross-sectional view of an assembly 204 subsequent to forming cavities 136 through the exterior layers of metal foil 132 and through the dielectric material 134 of the assembly 202 (FIG. 3B). In some embodiments, these cavities 136 may be tapered, narrowing towards the temporary support 130, as shown. In some embodiments, the cavities 136 may be formed by laser drilling, with the metal foil 132 on the temporary support 130 acting as a laser stop for this process. A desmear operation to clean the cavities 136 may also be performed.

Figure 3D:
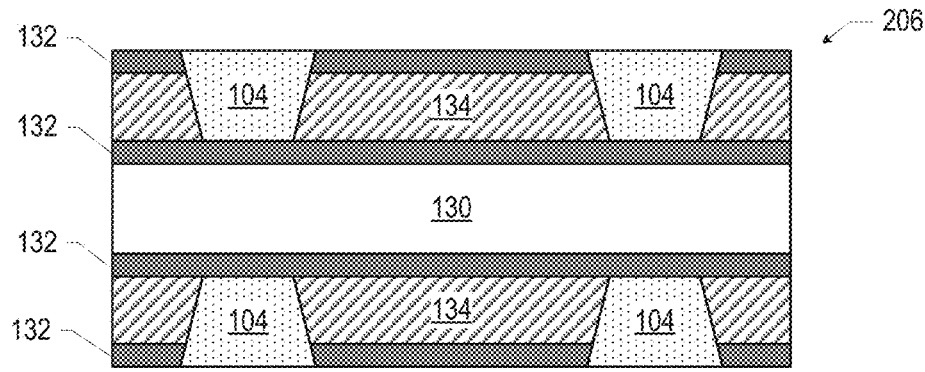

FIG. 3D is a side, cross-sectional view of an assembly 206 subsequent to filling the cavities 136 of the assembly 204 (FIG. 3C) with magnetic material 104. The magnetic material 104 may take the form of any of the embodiments disclosed herein. In some embodiments, filling the cavities 136 with the magnetic material 104 may be performed by plug pasting a magnetic composite paste into the cavities 136, followed by grinding to remove the excess magnetic composite paste. In some embodiments, the magnetic composite paste may be stencil printed into the cavities 136; process parameters such as squeezing pressure, squeezing speed, viscosity of paste, and mask thickness and feature sizes may be varied to control the plugging morphology of the magnetic material 104 in the cavities 136. Printing accuracy with stencil printing may be improved by monitoring alignment with fiducials using a camera and compensating dynamically for any shrinkage or scaling.

Figure 3E:
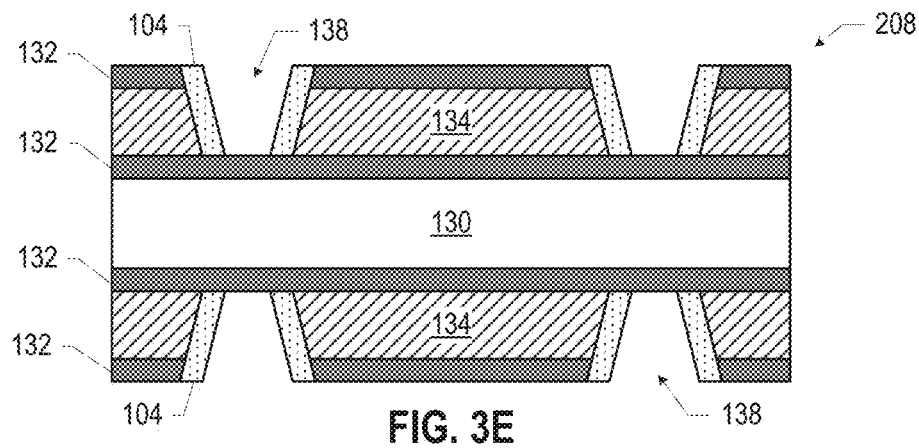

FIG. 3E is a side, cross-sectional view of an assembly 208 subsequent to forming cavities 138 through the magnetic material 104 of the assembly 206 (FIG. 3D). In some embodiments, these cavities 138 may be tapered, narrowing towards the temporary support 130, as shown. In some embodiments, the cavities 138 may be formed by laser drilling, with a metal foil 132 on the temporary support 130 acting as a laser stop. A desmear operation to clean the cavities 138 may also be performed.

Figure 3F:
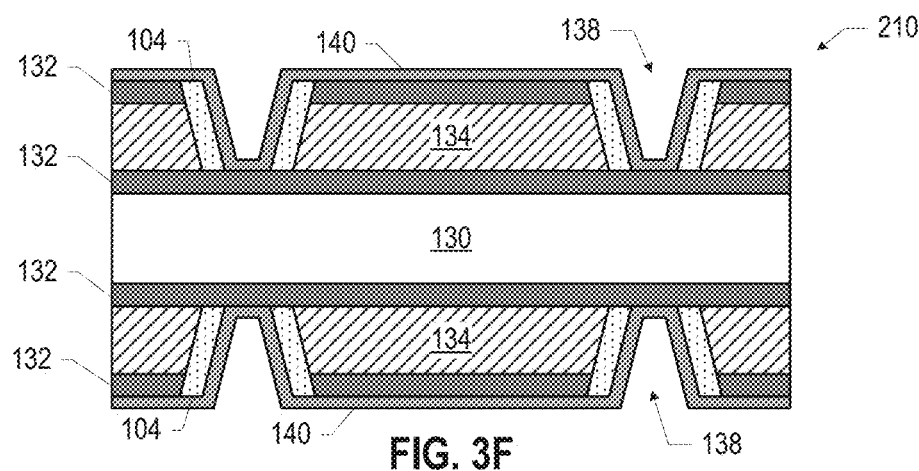

FIG. 3F is a side, cross-sectional view of an assembly 210 subsequent to forming metal seed layers 140 (e.g., copper seed layers) on the exposed faces of the assembly 208 (FIG. 3E). In some embodiments, the metal seed layers 140 may be formed by electroless deposition, and may have any suitable thickness (e.g., between 1 micron and 5 microns).

Figure 3G:
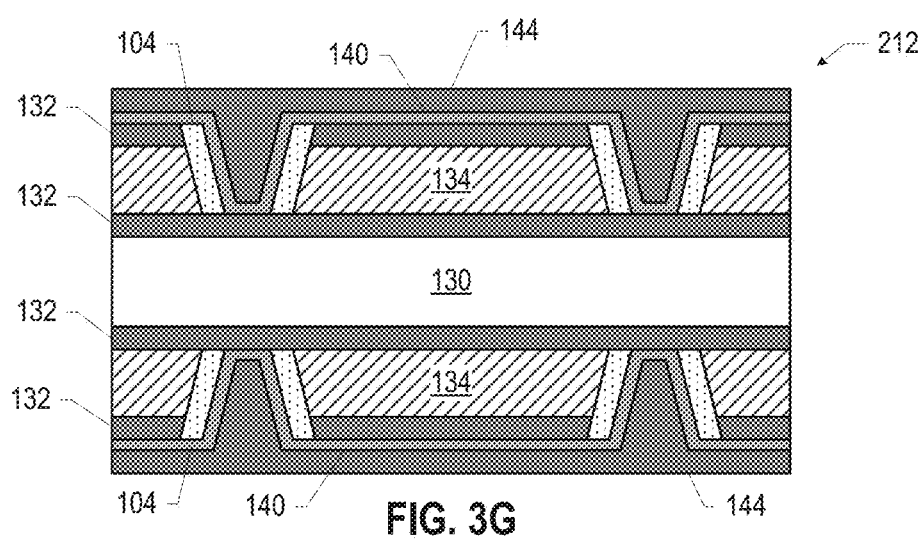

FIG. 3G is a side, cross-sectional view of an assembly 212 subsequent to depositing a metal 144 on the assembly 210 (FIG. 3F) to fill the cavities 138 and provide an "overburden" of the metal 144. The metal 144 may be deposited by electrolytic plating, for example. In some embodiments, the metal 144 may be planarized (e.g., by chemical mechanical planarization (CMP)) subsequent to deposition. The thickness of the "overburden" of the metal 144 may take any suitable value (e.g., between 20 microns and 35 microns).

Figure 3H:
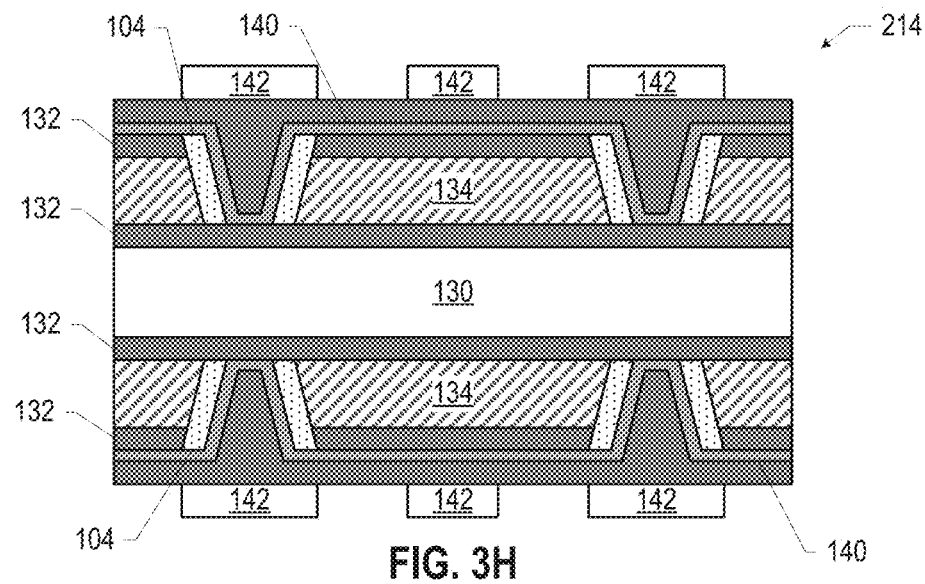

FIG. 3H is a side, cross-sectional view of an assembly 214 subsequent to depositing a layer of photoresist 142 on the overburden of the metal 144 of the assembly 212 (FIG. 3G), and then patterning the photoresist 142. The photoresist 142 may be deposited using any suitable technique (e.g., spin-on deposition). The photoresist 142 may be patterned using any suitable technique (e.g., a photolithographic technique, as known in the art).

Figure 3I:
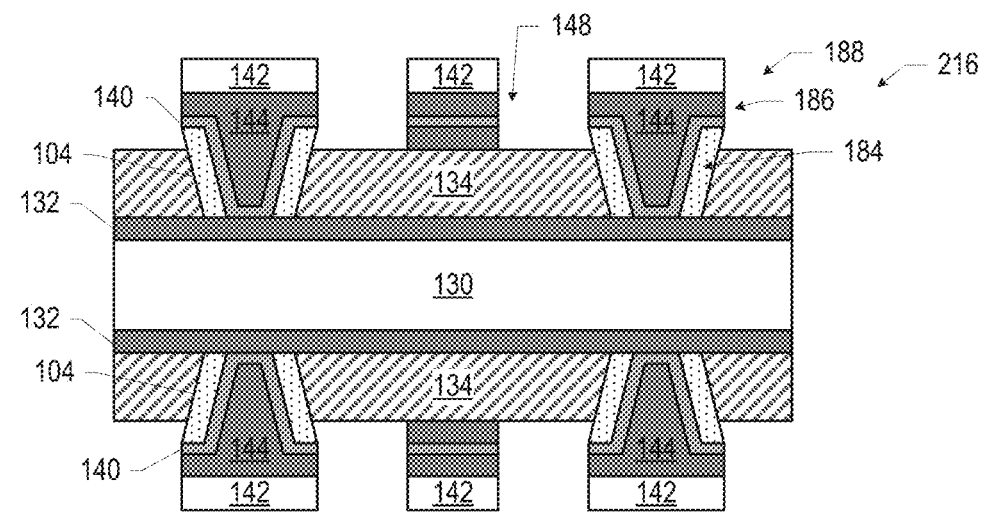

FIG. 3I is a side, cross-sectional view of an assembly 216 subsequent to patterning the metal 144 and the metal seed layer 140 in accordance with the pattern of the photoresist 142 of the assembly 214 (FIG. 3H). In particular, the metal 144 and metal seed layer 140 not "protected" by the photoresist 142 may be etched away, and the underlying dielectric material 134 exposed. The remaining metal seed layer 140/metal 144 may include inductor portions 188 that include a via portion 184 (having a V-shape in cross-section) and a substantially horizontal pad portion 186 above the via portion 184. The pad portion 186 may be wider than the via portion 184, and may act as a laser stop during subsequent manufacturing operations (e.g., as discussed below with reference to FIG. 3L). Some of the remaining metal seed layer 140/metal 144 may provide conductive lines/pads 148, as shown.

Figure 3J:
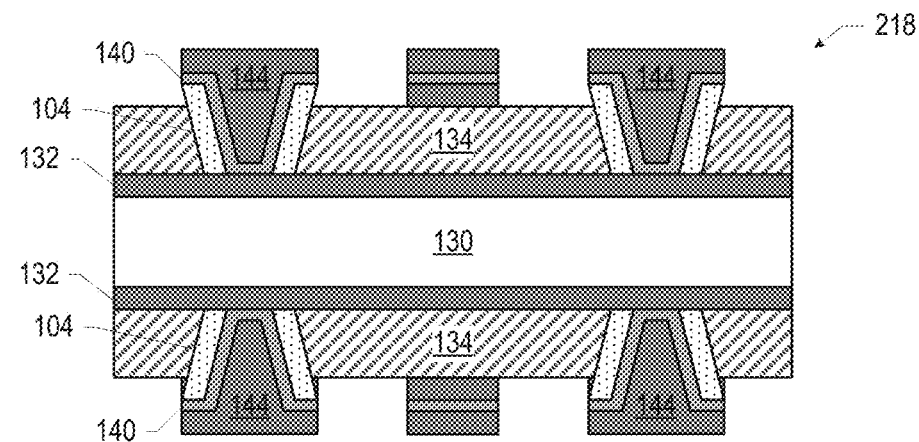

FIG. 3J is a side, cross-sectional view of an assembly 218 subsequent to removing the photoresist 142 from the assembly 216 (FIG. 3I). The photoresist 142 may be removed by any known technique.

Figure 3K:
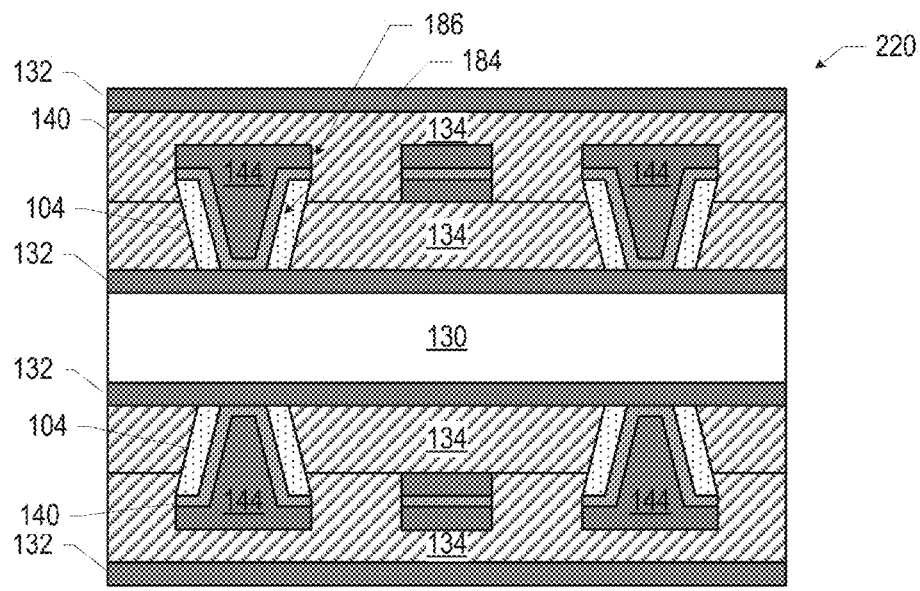

FIG. 3K is a side, cross-sectional view of an assembly 220 subsequent to attaching a layer of dielectric material 134 and an additional layer of metal foil 132 on opposing faces of the assembly 218 (FIG. 3J). This additional dielectric material 134/metal foil 132 may be attached in accordance with any of the embodiments discussed above with reference to FIG. 3B (e.g., using a hot pressing technique).

Figure 3L:
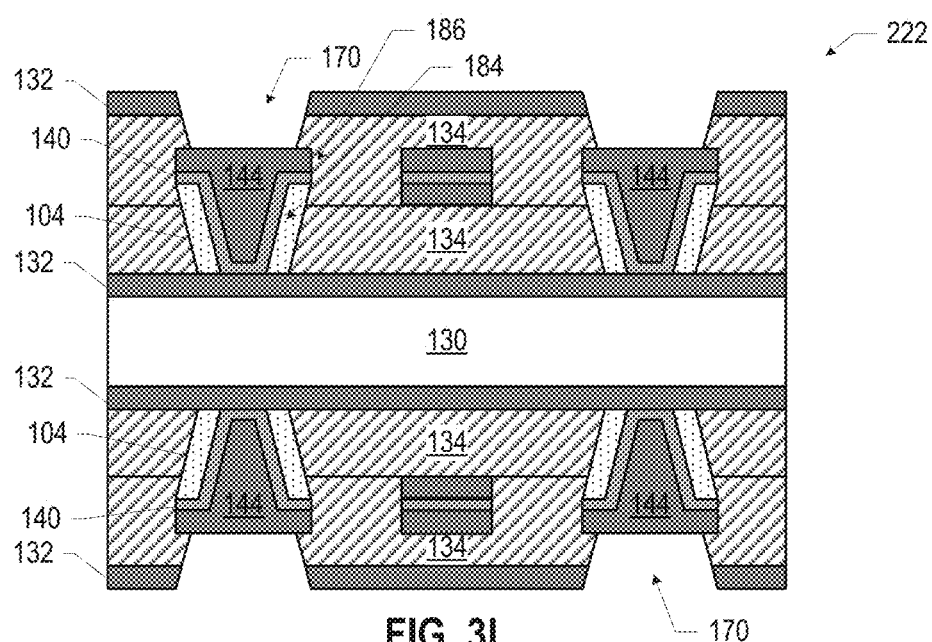

FIG. 3L is a side, cross-sectional view of an assembly 222 subsequent to forming cavities 170 through the exterior layers of metal foil 132 and through the outermost dielectric material 134 of the assembly 220 (FIG. 3K). The cavities 170 may be formed in accordance with any of the embodiments of the formation of the cavities 136 discussed above with reference to FIG. 3C. For example, the cavities 170 may be formed by laser drilling, with the pad portions 186 of the inductor portions 188 acting as a laser stop for this process. A desmear operation to clean the cavities 170 may also be performed.

Figure 3M:
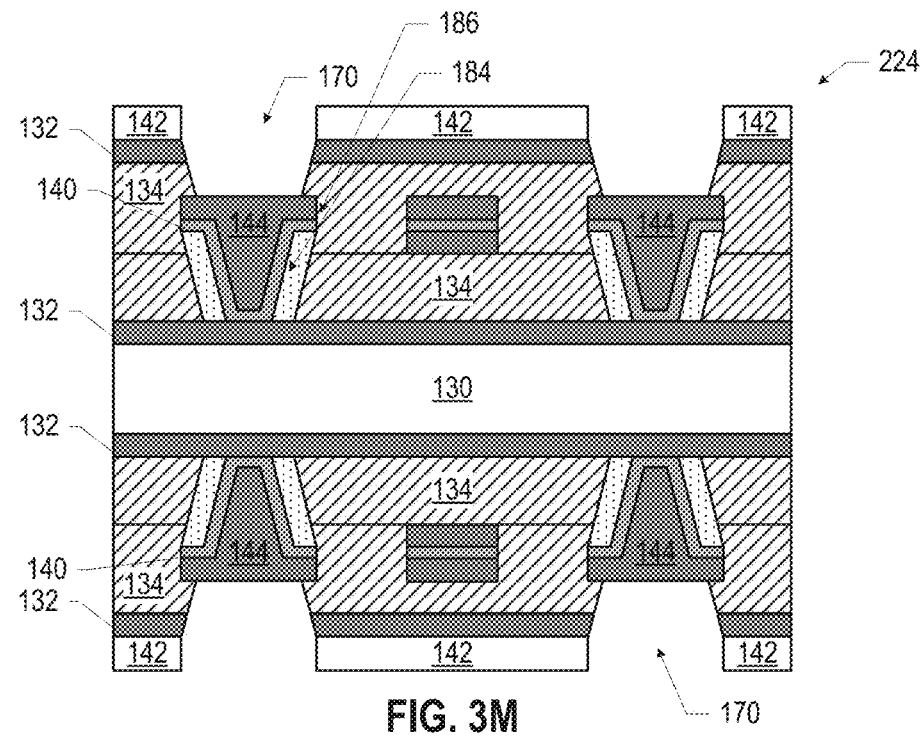

FIG. 3M is a side, cross-sectional view of an assembly 224 subsequent to depositing a layer of photoresist 142 on the assembly 222 (FIG. 3L), and then patterning the photoresist 142 so as to leave the cavities 170 exposed. The photoresist 142 may be deposited in patterned using any suitable technique (e.g., as discussed above with reference to FIG. 3H).

Figure 3N:
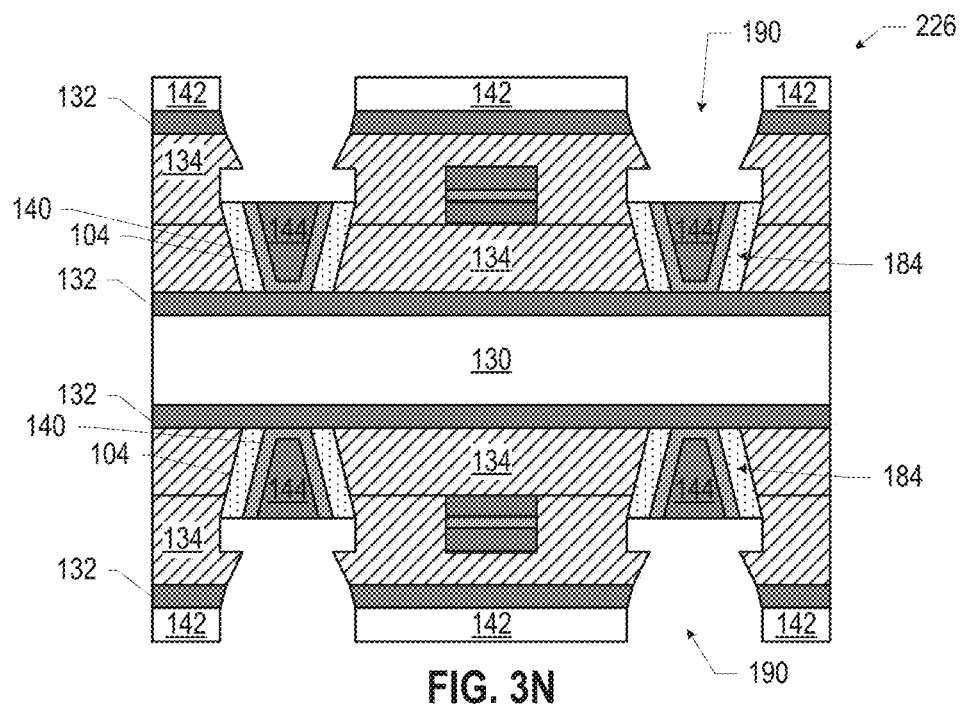

FIG. 3N is a side, cross-sectional view of an assembly 226 subsequent to etching the metal 144 and the metal seed layer 140 exposed at the bottom of the cavities 170 in the assembly 224 (FIG. 3M) (i.e., patterning the metal 144/metal seed layer 140 in accordance with the pattern of the photoresist 142 of the assembly 224). The etch of the metal 144/metal seed layer 140 may be a timed etch that removes the pad portions 186 while leaving the via portions 184 of the inductor portions 188 in place. The result of the etch may be cavities 190 in the assembly 226.

Figure 3O:
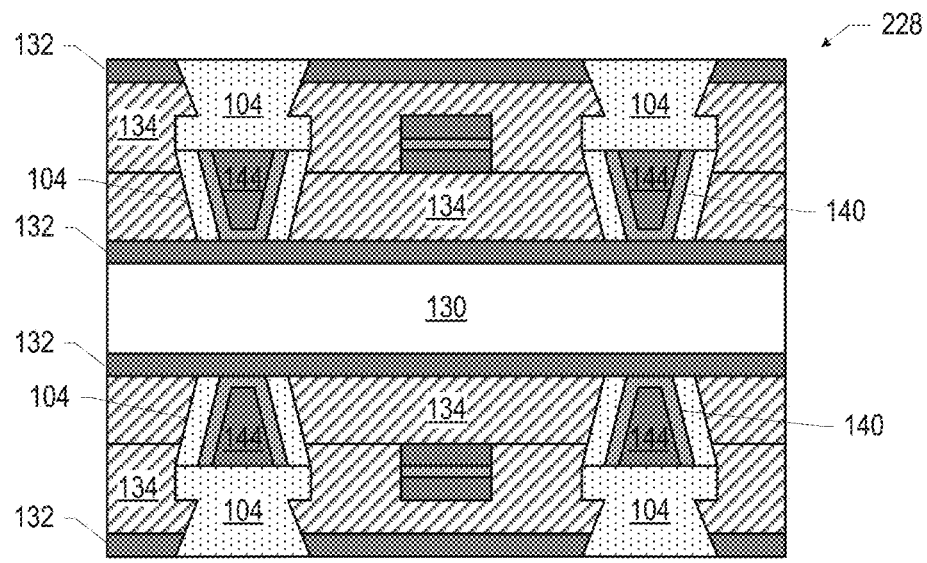

FIG. 3O is a side, cross-sectional view of an assembly 228 subsequent to filling the cavities 190 of the assembly 226 (FIG. 3N) with magnetic material 104. The magnetic material 104 may take the form of any of the embodiments disclosed herein, and the cavities 190 may be filled with the magnetic material 104 in accordance with any of the techniques discussed above with reference to FIG. 3D.

Figure 3P:
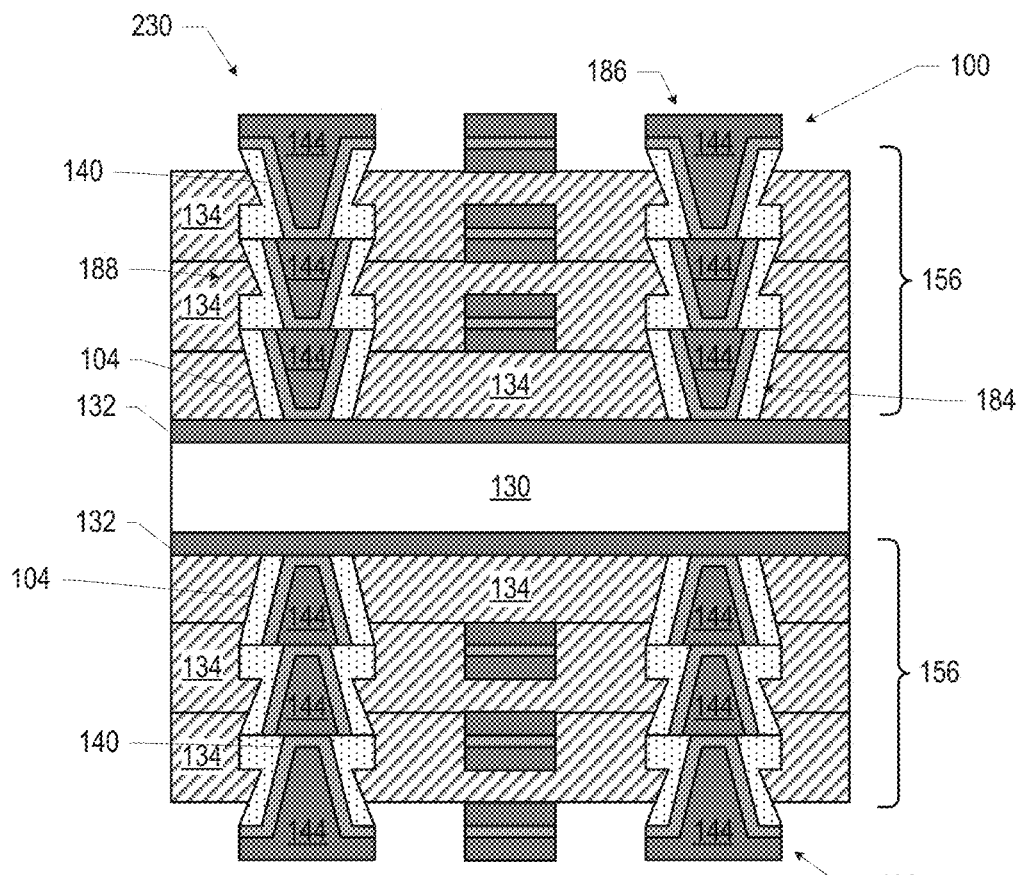

FIG. 3P is a side, cross-sectional view of an assembly 230 subsequent to repeating the operations discussed above with reference to FIGS. 3E-3J twice to form two additional layers of inductor portions 188. The assembly 230 may thus include stacks of via portions 184 (with a pad portion 186 at the exterior of the stack), as shown. Although the assembly 230 illustrated in FIG. 3P includes 3 via portions 184 in each stack, this is simply illustrative, and any desired number of via portions 184 may be formed by repeating the operations described above as suitable (e.g., to form a solenoid 102 with a desired number of windings to achieve a desired Q value). The assembly 230 includes a core region 156 at either side of the temporary support 130, and this core region 156 includes an inductor 100 whose solenoid 102 includes the inductor portions 188.

Figure 3Q:
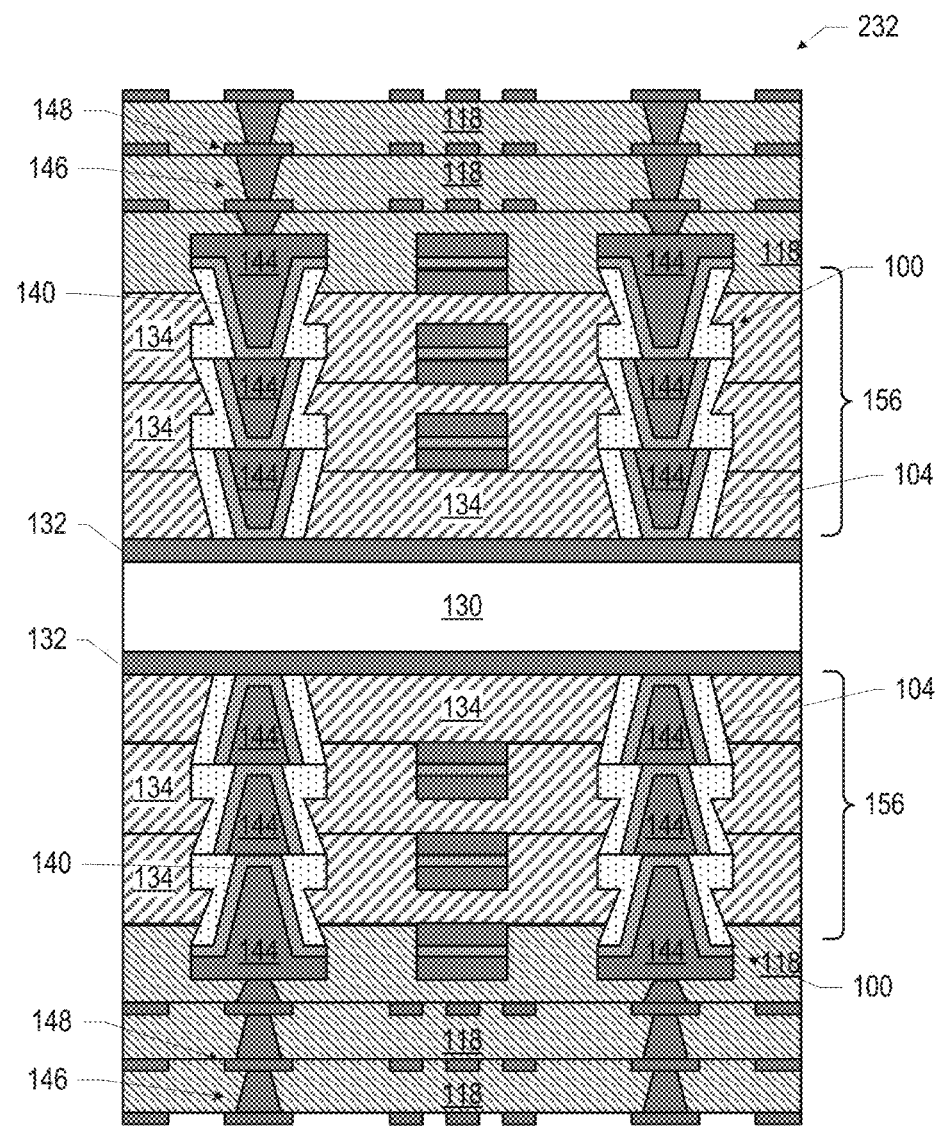

FIG. 3Q is a side, cross-sectional view of an assembly 232 subsequent to forming buildup layers at opposite faces of the assembly 230 (FIG. 3P). As discussed above with reference to FIG. 2, the buildup layers may include a dielectric material 118 and conductive lines/pads 148 and conductive vias 146 therein. The buildup layers may be formed using any suitable technique; for example, the buildup layers may be formed by laminating layers of the dielectric material 118 onto the assembly 230, forming a first set of conductive vias 146 in this layer of dielectric material 118 using the laser patterning and fill techniques discussed above, and then performing a semi-additive patterning (SAP) process to form additional conductive pad/lines 148 and conductive vias 146. When machinery that operates on both faces concurrently is used, the same number of buildup layers may be formed on both faces of the assembly 232. Although the assembly 232 illustrated in FIG. 3Q includes 3 buildup layers at either face, this is simply illustrative, and any desired number of buildup layers may be formed.

Figure 3R:
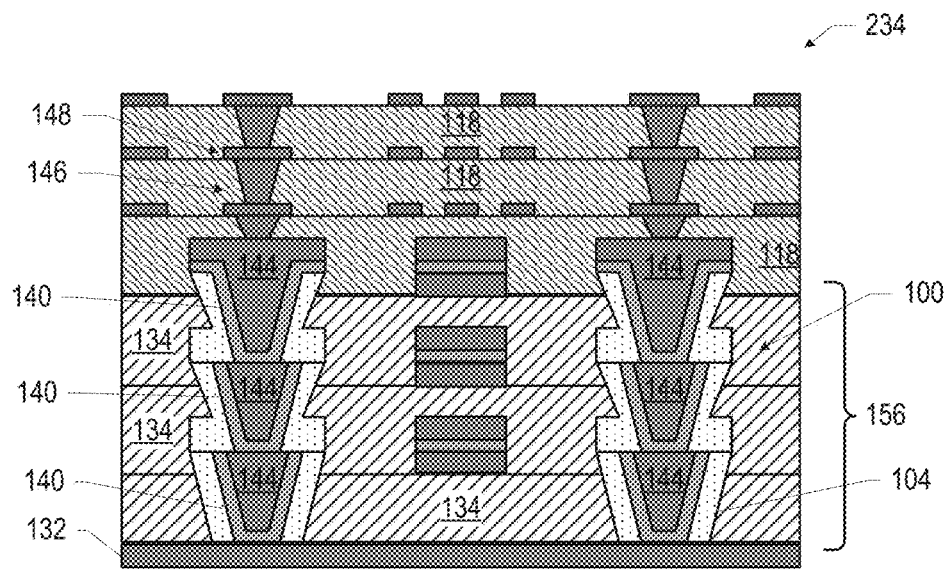
Figure 3S:
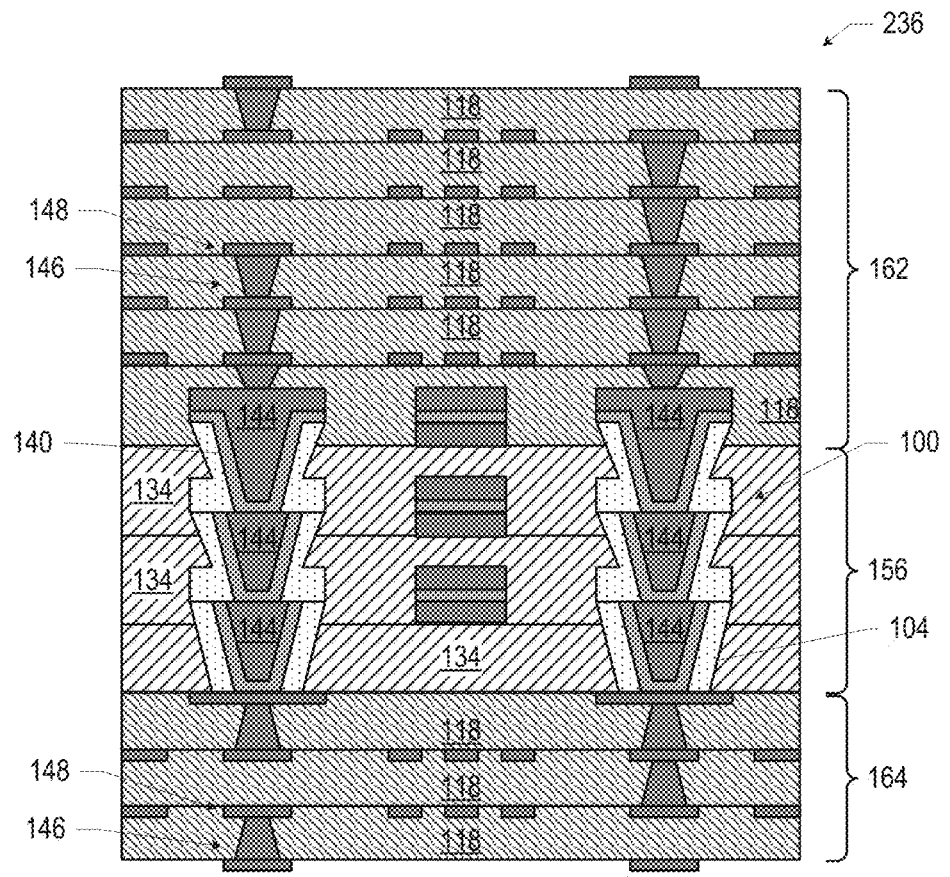

FIG. 3R is a side, cross-sectional view of an assembly 234 subsequent to removing the temporary support 130 from the assembly 232 (FIG. 3Q); 2 copies of the assembly 234 will result from this operation, but only one is shown in FIGS. 3R-3T for ease of illustration. The assembly 234 may include an exposed layer of metal foil 132 at the face formerly proximate to the temporary support 130.

FIG. 3S is a side, cross-sectional view of an assembly 236 subsequent to removing the exposed layer of metal foil 132 of the assembly 234 (FIG. 3R) and then forming additional buildup layers at opposite faces of the resulting assembly. These buildup layers may take the form of the buildup layers discussed above with reference to FIG. 3Q. When machinery that operates on both faces concurrently is used, the same number of buildup layers may be formed on both faces of the assembly 236. Although the assembly 236 illustrated in FIG. 3S includes 3 additional buildup layers at either face, this is simply illustrative, and any desired number of additional buildup layers may be formed. The assembly 236 may thus include the first buildup region 162, the second buildup region 164 (having a different thickness/different number of layers than the first buildup region 162), and the core region 156 therebetween.

FIG. 3T is a side, cross-sectional view of an assembly 238 subsequent to depositing layers of solder resist material 114 on both faces of the assembly 236 (FIG. 3S), forming openings in the solder resist material 114 (e.g., by photolithography) to expose the conductive contacts 110 and 112, and forming solder balls 116 in contact with the conductive contacts 110. The openings may taper towards the conductive contacts 110 and 112, as shown. The resulting assembly 238 may take the form of the IC package support 150 of FIG. 2.

FIG. 4 illustrates another example IC package support 150 that is another particular embodiment of the IC package support 150 of FIG. 1. In particular, the IC package support 150 of FIG. 4 includes a core region 156 having an inductor 100 therein, a first buildup region 162, and a second buildup region 164. The thickness of the first buildup region 162 of the IC package support 150 of FIG. 4 is greater than the thickness of the second buildup region 164. A number of elements of FIG. 4 are shared with other figures; for ease of discussion, a description of these elements is not repeated, and these elements may take the form of any of the embodiments disclosed herein.

The buildup regions 162 and 164 of the IC package support 150 of FIG. 4 may take the form of any of these elements discussed above with reference to FIG. 2. The core region 156 of the IC package support 150 of FIG. 4 differs from the core region 156 of the IC package support 150 of FIG. 2 in that the core region 156 of FIG. 4 includes a first core portion 156-1 including a solenoid 102 with via portions that extend all the way through a dielectric material 166 of the first core portion 156-1, and a second core portion 156-2 including a layer of the dielectric material 135 and conductive vias 146 and conductive lines/pads 148 therein. A magnetic material 104 may laterally surround the via portions of the solenoid 102 in the first core portion 156-1, as shown. In some embodiments, the via portions of the solenoid 102 in the first core portion 156-1 may not be tapered, but may have substantially parallel sidewalls, as shown. The second core portion 156-2 is between the first core portion 156-1 and the second buildup region 164, as shown. The thickness of the first core portion 156-1 may be greater than the thickness of the second core portion 156-2.

The IC package support 150 of FIG. 4 may be manufactured using any suitable techniques. For example, FIGS. 5A-5G illustrate stages in an example process for manufacturing the IC package support 150 of FIG. 4. The operations discussed below with reference to FIGS. 5A-5C and 5F-5G may be performed by machinery that operates on both opposing faces of a temporary support; such machinery is more typically used in the manufacture of coreless IC package supports, and thus the ability to utilize such machinery may be an advantage of the method of FIG. 5.

Figure 5A:
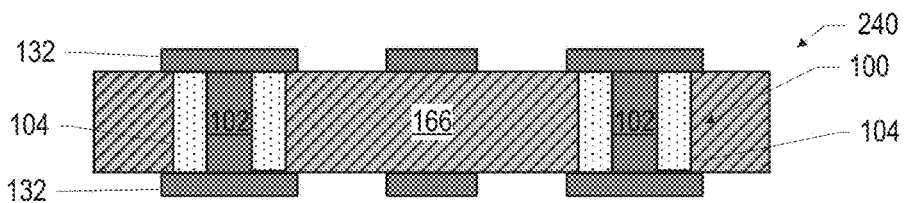
FIGS. 5A-5G illustrate stages in an example process of manufacturing the asymmetric cored IC package support of FIG. 4, in accordance with various embodiments.

FIG. 5A is a side, cross-sectional view of an assembly 240 including a dielectric material 166 having via portions through the thickness of the dielectric material 166. Magnetic material 104 may laterally surround the via portions, and a patterned layer of metal foil 132 may be disposed at opposite faces of the assembly 240. In some embodiments, the patterned layer of metal foil 132 may electrically connect the via portions to provide a solenoid 102 for an inductor 100. The assembly 240 may be manufactured using a core process; for example, a copper clad laminate (including the dielectric material 166 and the adjacent metal foil 132) may be mechanically drilled, the holes may be filled with the magnetic material 104, another set of holes may be drilled through the magnetic material 104, these holds may be plated with the material of the solenoid 102 (e.g., copper plated by an electroless process followed by an electrolytic process), and then the metal foil 132 may be patterned (e.g., using a subtractive etch process).

Figure 5B:
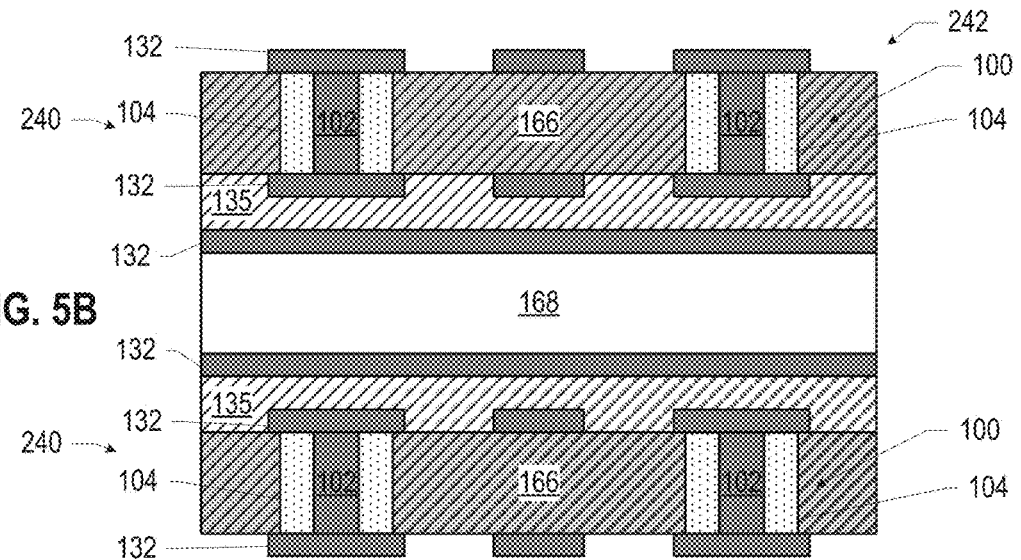

FIG. 5B is a side, cross-sectional view of an assembly 242 subsequent to attaching two copies of the assembly 240 (FIG. 5A) to a temporary support 168. The temporary support 168 may have a layer of metal foil 132 at opposite faces of the temporary support 168, and a layer of dielectric material 135 may be disposed between the layer of metal foil 132 and the proximate assembly 240. In some embodiments, the temporary support 168 may be a conventional core, while in other embodiments, the temporary support 168 may be an adhesive that joins the proximate layers of metal foil 132 into a double-sided metal foil. Using a conventional core as the temporary support 168 may provide advantageous mechanical stiffness, but may result in an assembly 242 that is too thick for some processing tools to manage; in such situations, using an adhesive as a temporary support 168 as part of a double-sided metal foil may be advantageous (and adequate stiffness may be provided by the assemblies 240). The dielectric material 135 (e.g., a glass cloth prepreg material) may be used to attach the assemblies 240 to the temporary support 168 and the proximate metal foils 132 using any of the techniques discussed above with reference to FIG. 3B (e.g., hot pressing).

Figure 5C:
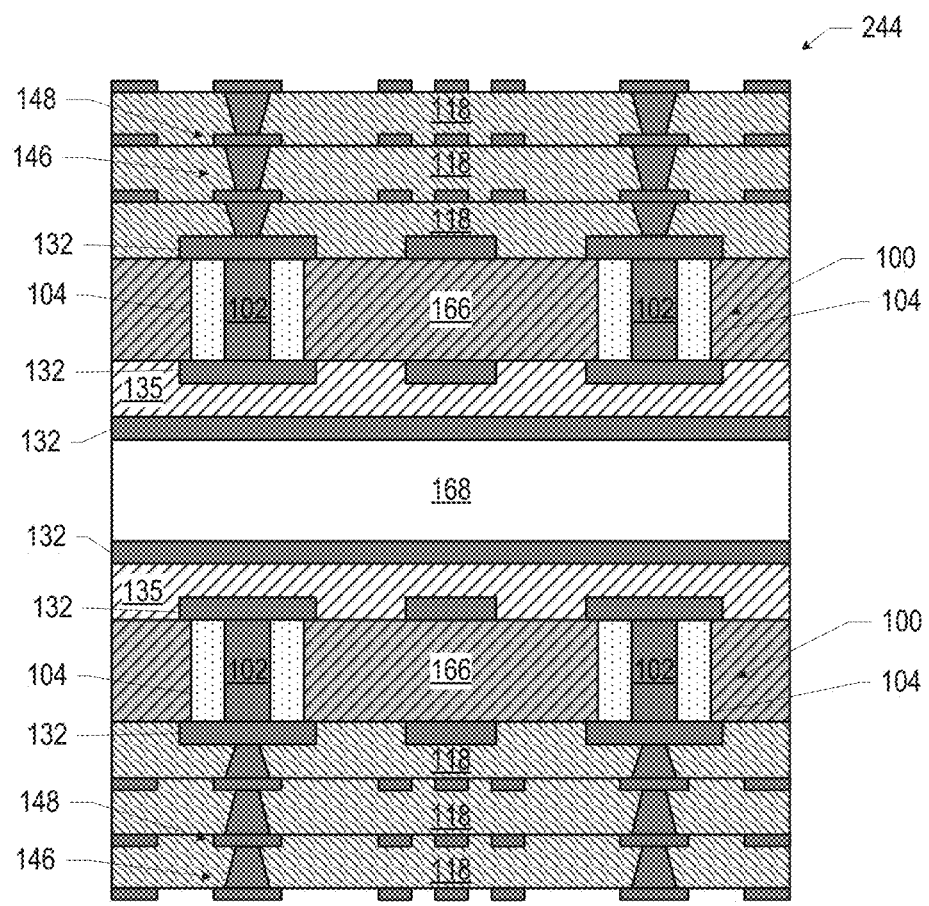

FIG. 5C is a side, cross-sectional view of an assembly 244 subsequent to forming buildup layers at opposite faces of the assembly 242 (FIG. 5B). The buildup layers may be formed in accordance with any of the techniques discussed above with reference to FIG. 3Q. As discussed above with reference to FIG. 3Q, when machinery that operates on both faces concurrently is used, the same number of buildup layers may be formed on both faces of the assembly 242. Although the assembly 244 illustrated in FIG. 5C includes 3 buildup layers at either face, this is simply illustrative, and any desired number of buildup layers may be formed.

Figure 5D:
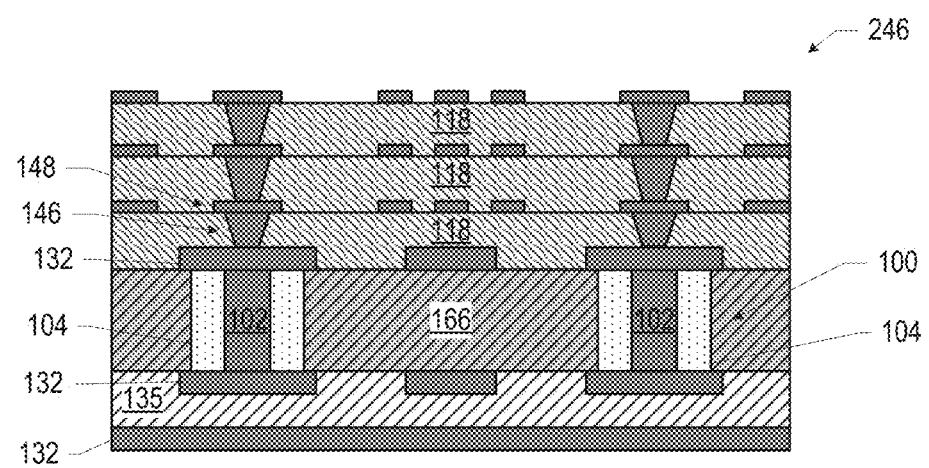

FIG. 5D is a side, cross-sectional view of an assembly 246 subsequent to removing the temporary support 168 from the assembly 244 (FIG. 5C); 2 copies of the assembly 246 will result from this operation, but only one is shown in FIGS. 5D-5G for ease of illustration. The assembly 246 may include an exposed layer of metal foil 132 at the face formerly proximate to the temporary support 168.

Figure 5E:
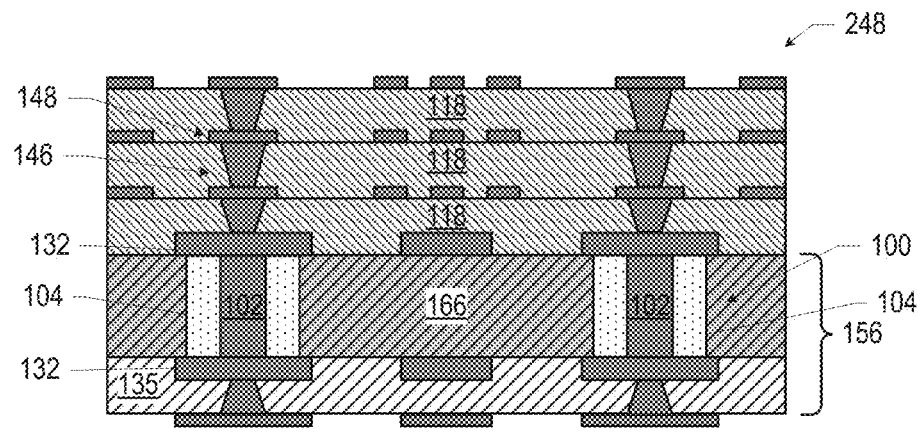

FIG. 5E is a side, cross-sectional view of an assembly 248 subsequent to removing the exposed layer of metal foil 132 of the assembly 246 (FIG. 5D), and then forming conductive vias 146 and/or conductive lines/pads 148 in and on the newly exposed layer of dielectric material 135 (e.g., in accordance with any of the techniques discussed above for forming conductive vias 146 and/or conductive lines/pads 148 in or on a layer of dielectric material 135). The assembly 248 may thus include the core region 156 of the IC package support 150 of FIG. 4.

Figure 5F:
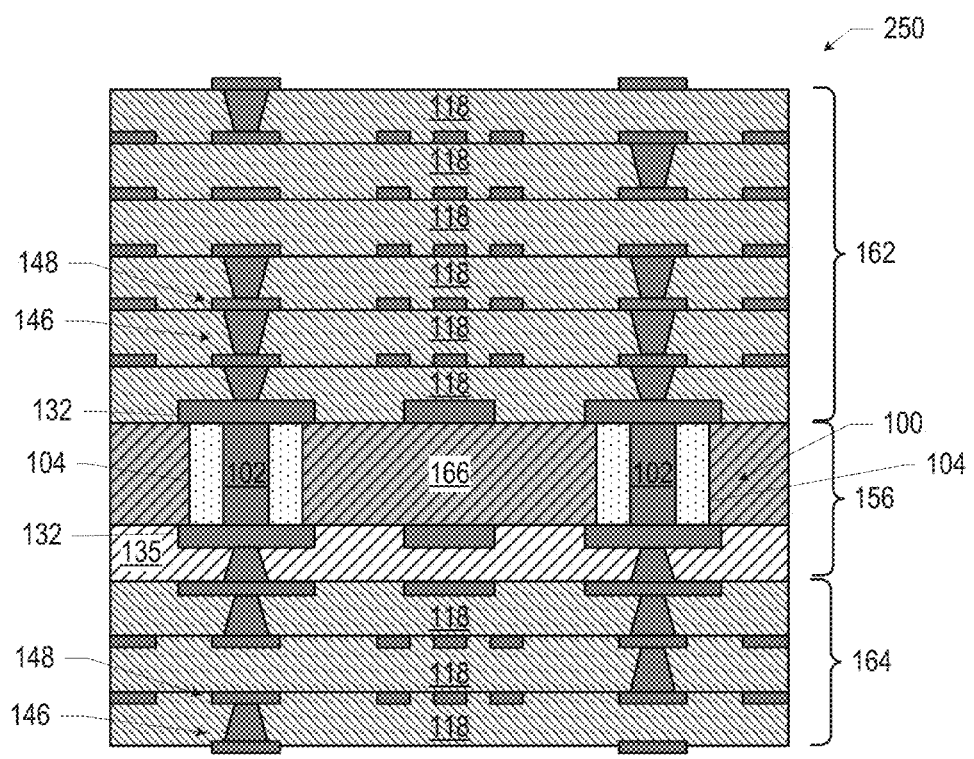

FIG. 5F is a side, cross-sectional view of an assembly 250 subsequent to forming additional buildup layers at opposite faces of the assembly 248 (FIG. 3E). These buildup layers may take the form of the buildup layers discussed above with reference to FIG. 3Q. When machinery that operates on both faces concurrently is used, the same number of buildup layers may be formed on both faces of the assembly 248. Although the assembly 250 illustrated in FIG. 5F includes 3 additional buildup layers at either face, this is simply illustrative, and any desired number of additional buildup layers may be formed. The assembly 250 may thus include the first buildup region 162, the second buildup region 164 (having a different thickness/different number of layers than the first buildup region 162), and the core region 156 therebetween.

Figure 5G:
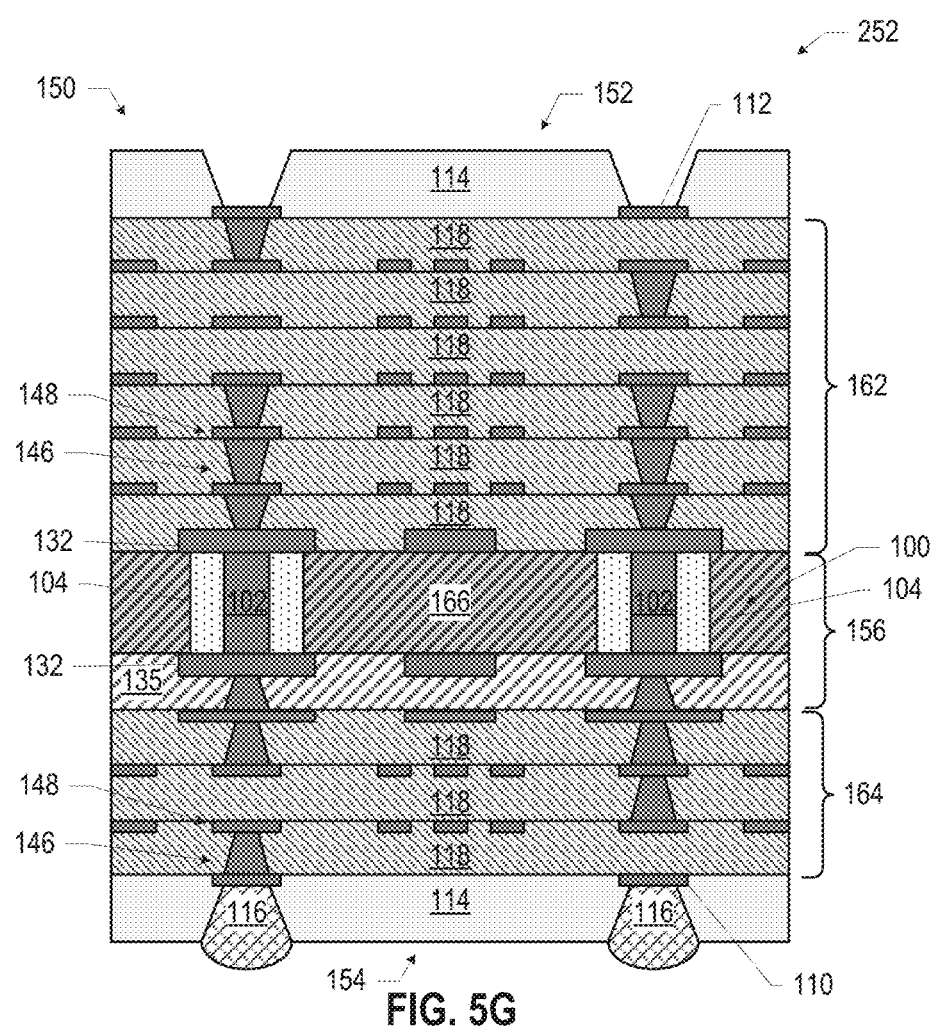

FIG. 5G is a side, cross-sectional view of an assembly 252 subsequent to depositing layers of solder resist material 114 on both faces of the assembly 250 (FIG. 5F), forming openings in the solder resist material 114 (e.g., by photolithography) to expose the conductive contacts 110 and 112, and forming solder balls 116 in contact with the conductive contacts 110. The openings may taper towards the conductive contacts 110 and 112, as shown. The resulting assembly 252 may take the form of the IC package support 150 of FIG. 4.

The inductors 100 and IC package supports 150 disclosed herein may include, or be included in, any suitable electronic component. FIGS. 6-10 illustrate various examples of apparatuses that may include any of the inductors 100 or IC package supports 150 disclosed herein, or may be included in an IC package that also includes any of the inductors 100 or IC package supports 150 disclosed herein.

Figure 6:
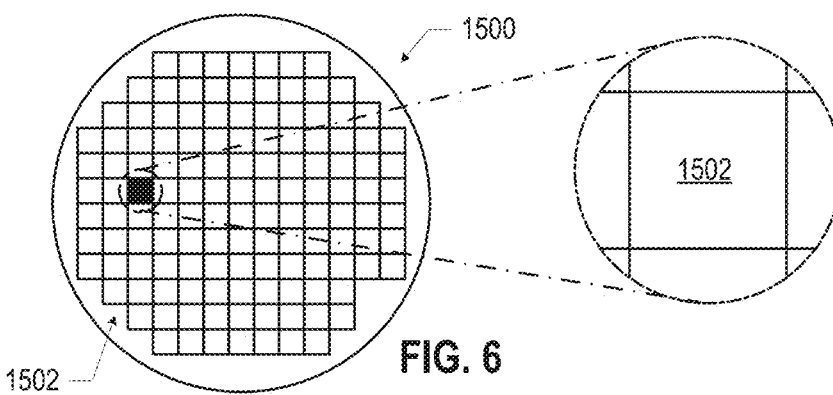
FIG. 6 is a top view of a wafer and dies that may be included in an IC package having an asymmetric cored IC package support in accordance with any of the embodiments disclosed herein.

FIG. 6 is a top view of a wafer 1500 and dies 1502 that may be included in an IC package including one or more inductors 100 or IC package supports 150 (e.g., as discussed below with reference to FIG. 8) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 7, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 10) or other logic that is configured to store information in the memory devices or execute instructions stored in the memory array.

Figure 7:
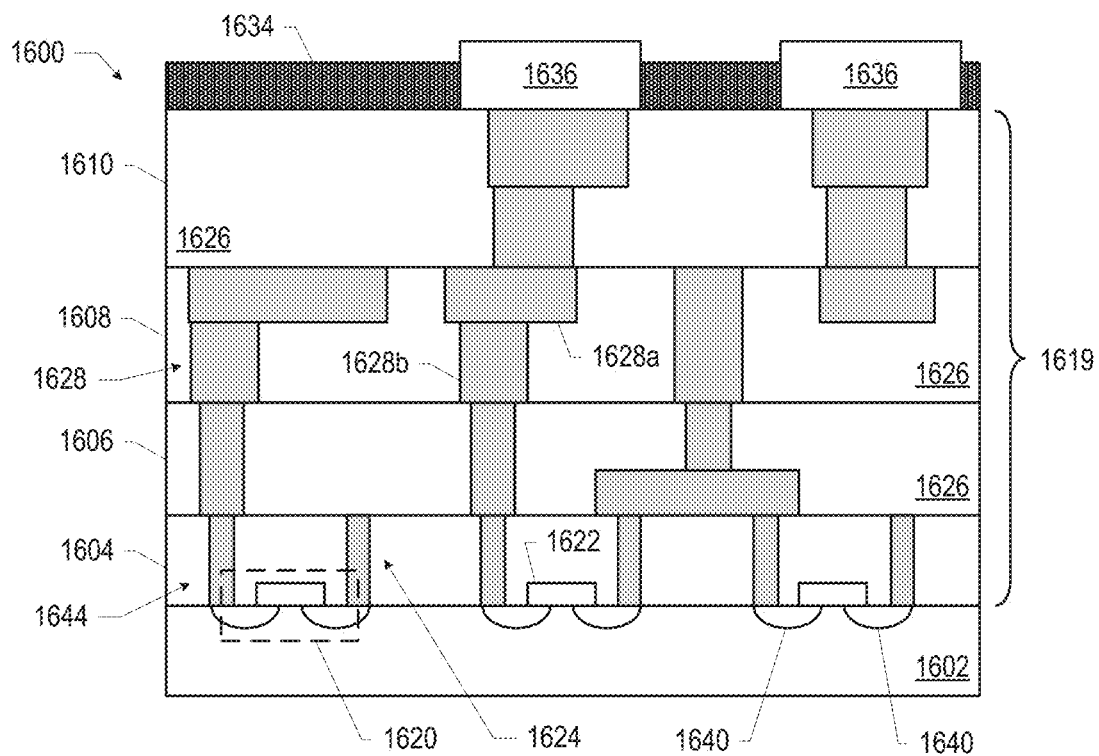
FIG. 7 is a side, cross-sectional view of an IC device that may be included in an IC package having an asymmetric cored IC package support, in accordance with any of the embodiments disclosed herein.

FIG. 7 is a side, cross-sectional view of an IC device 1600 that may be included in an IC package including one or more inductors 100 or IC package supports 150 (e.g., as discussed below with reference to FIG. 8), in accordance with any of the embodiments disclosed herein. One or more of the IC devices 1600 may be included in one or more dies 1502 (FIG. 6). The IC device 1600 may be formed on a substrate 1602 (e.g., the wafer 1500 of FIG. 6) and may be included in a die (e.g., the die 1502 of FIG. 6). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 6) or a wafer (e.g., the wafer 1500 of FIG. 6).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 7 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604

(illustrated in FIG. 7 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 7). Although a particular number of interconnect layers 1606-1610 is depicted in FIG. 7, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 7. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 7. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 7, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 8:
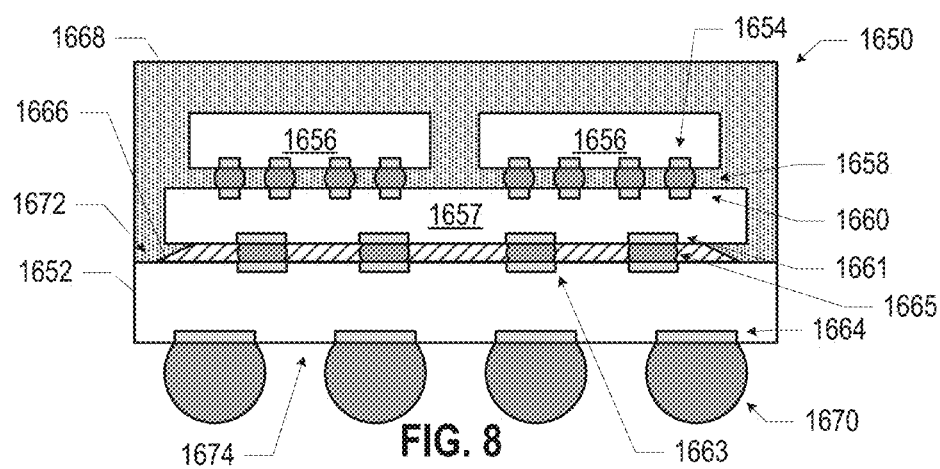
FIG. 8 is a side, cross-sectional view of an IC package that may include an asymmetric cored IC package support, in accordance with any of the embodiments disclosed herein.

FIG. 8 is a side, cross-sectional view of an example IC package 1650 that may include one or more inductors 100 in an IC package support 150. For example, the package substrate 1652 or the interposer 1657 (discussed further below) may be an IC package support 150 and may include one or more inductors 100 in accordance with any of the embodiments disclosed herein. In some embodiments, the IC package 1650 may be a system-in-package (SiP).

The package substrate 1652 may be formed of a dielectric material (e.g., a ceramic, a dielectric buildup film, an epoxy resin film having filler particles therein, etc.), and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 7. In some embodiments, the package substrate 1652 may include one or more inductors 100 in accordance with any of the embodiments disclosed herein. In some embodiments, no inductors 100 may be included in the package substrate 1652.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 or to the inductors 100 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 8 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665.

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 8 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. In some embodiments, a thermal management device (not shown), such as a heat sink or a heat spreader, may be in thermal contact with the dies 1656 (e.g., when the mold compound 1668 is or is not present). The second-level interconnects 1670 illustrated in FIG. 8 are solder balls (e.g., for a ball grid array arrangement), but any suitable second-level interconnects 1670 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 9.

In some embodiments, the interposer 1657 may include one or more inductors 100 in accordance with any of the embodiments disclosed herein. In some embodiments, no inductors 100 may be included in the package substrate 1652. The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory).

Although the IC package 1650 illustrated in FIG. 8 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 8, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 9:
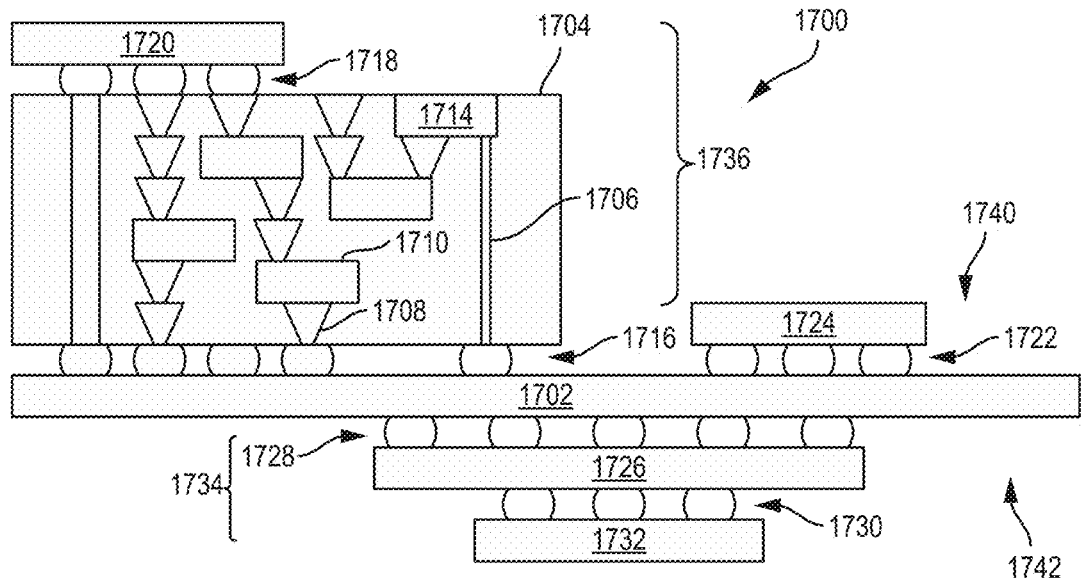
FIG. 9 is a side, cross-sectional view of an IC device assembly that may include an asymmetric cored IC package support, in accordance with any of the embodiments disclosed herein.

FIG. 9 is a side, cross-sectional view of an IC device assembly 1700 that may include one or more IC packages including one or more of the inductors 100 and/or IC package supports 150 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 8 (e.g., may include one or more inductors 100 in an IC package support 150).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 9 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 9), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 9, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 6), an IC device (e.g., the IC device 1600 of FIG. 7), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 9, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more inductors 100.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 9 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 10:
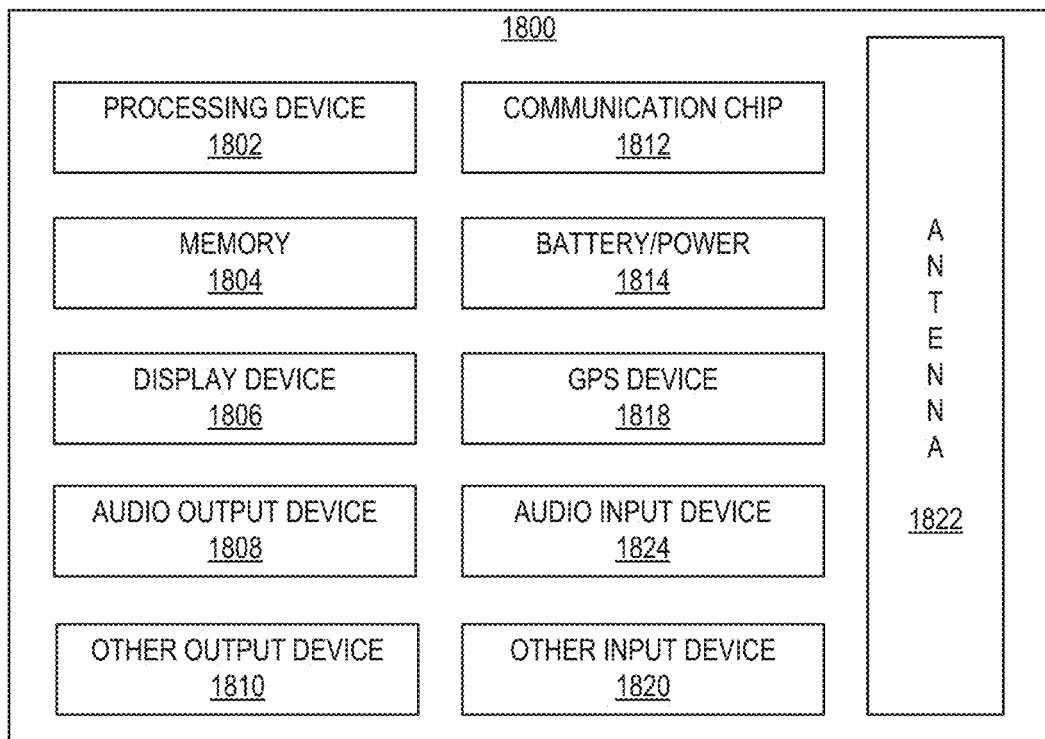
FIG. 10 is a block diagram of an example electrical device that may include an asymmetric cored IC package support, in accordance with any of the embodiments disclosed herein.

FIG. 10 is a block diagram of an example electrical device 1800 that may include one or more IC package supports 150 including one more inductors 100 in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 10 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 10, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) package support, including: a core region having a first face and an opposing second face; a first buildup region at the first face of the core region; and a second buildup region at the second face of the core region; wherein a thickness of the first buildup region is different than a thickness of the second buildup region.

Example 2 includes the subject matter of Example 1, and further specifies that the core region includes a first dielectric material, the first buildup region includes a second dielectric material, and the first dielectric material has a different material composition than a material composition of the second dielectric material.

Example 3 includes the subject matter of Example 2, and further specifies that the first dielectric material includes glass.

Example 4 includes the subject matter of any of Examples 2-3, and further specifies that the first dielectric material includes a prepreg fiber glass material.

Example 5 includes the subject matter of any of Examples 2-4, and further specifies that the second dielectric material includes a resin.

Example 6 includes the subject matter of any of Examples 2-5, and further specifies that the second dielectric material includes an epoxy resin film.

Example 7 includes the subject matter of any of Examples 2-6, and further specifies that the second buildup region includes a third dielectric material, and the first dielectric material has a different material composition than a material composition of the third dielectric material.

Example 8 includes the subject matter of Example 7, and further specifies that the second dielectric material includes a resin.

Example 9 includes the subject matter of any of Examples 7-8, and further specifies that the second dielectric material includes an epoxy resin film.

Example 10 includes the subject matter of any of Examples 7-9, and further specifies that the second dielectric material has a same material composition as the material composition of the third dielectric material.

Example 11 includes the subject matter of any of Examples 1-10, and further specifies that the first buildup region includes a first number of layers, the second buildup region includes a second number of layers, and the first number is different than the second number.

Example 12 includes the subject matter of any of Examples 1-11, and further specifies that the second buildup region includes two or fewer layers and the first buildup region includes more than two layers.

Example 13 includes the subject matter of any of Examples 1-12, and further specifies that the second buildup region includes three or fewer layers and the first buildup region includes more than three layers.

Example 14 includes the subject matter of any of Examples 1-13, and further specifies that the second buildup region includes three or fewer layers and the first buildup region includes more than six layers.

Example 15 includes the subject matter of any of Examples 1-13, and further includes: conductive contacts for first-level interconnects at a face of the first buildup region; and conductive contacts for second-level interconnects at a face of the second buildup region.

Example 16 includes the subject matter of any of Examples 1-15, and further includes: an inductor at least partially in the core region.

Example 17 includes the subject matter of Example 16, and further specifies that the inductor includes a solenoid and a magnetic material.

Example 18 includes the subject matter of Example 17, and further specifies that the inductor includes magnetic material in an interior of the solenoid and outside the interior of the solenoid.

Example 19 includes the subject matter of any of Examples 17-18, and further specifies that the magnetic material wraps around at least a portion of the solenoid.

Example 20 includes the subject matter of any of Examples 17-19, and further specifies that the solenoid includes multiple conductive vias in the core region.

Example 21 includes the subject matter of Example 20, and further specifies that the conductive vias have a height between 15 microns and 300 microns.

Example 22 includes the subject matter of any of Examples 17-21, and further specifies that a portion of the magnetic material has a V-shaped portion and a foot portion.

Example 23 includes the subject matter of any of Examples 17-22, and further specifies that the magnetic material includes a magnetic paste.

Example 24 includes the subject matter of any of Examples 1-23, and further specifies that the core region includes a first core region and a second core region, the second core region is between the first core region and the second buildup region, and the first core region is symmetric about a plane parallel to the first face and the second face.

Example 25 includes the subject matter of Example 24, and further specifies that the second core region includes one or more layers of a prepreg fiber glass material.

Example 26 includes the subject matter of any of Examples 1-25, and further specifies that the IC package support is a package substrate or an interposer.

Example 27 includes the subject matter of any of Examples 1-26, and further specifies that the core region has a thickness between 100 microns and 1000 microns.

Example 28 is an integrated circuit (IC) package, including: an IC package support having a core, wherein the IC package support includes a first buildup region including a first number of buildup layers at one face of the core, the IC package support includes a second buildup region including a second number of buildup layers at an opposite face of the core, and the first number is different than the second number; and a die coupled to the IC package support.

Example 29 includes the subject matter of Example 28, and further specifies that the die is coupled to conductive contacts of the second buildup region.

Example 30 includes the subject matter of Example 29, and further specifies that the second number is larger than the first number.

Example 31 includes the subject matter of any of Examples 28-30, and further specifies that the die includes a processing device.

Example 32 includes the subject matter of any of Examples 28-31, and further specifies that the IC package support further includes an inductor at least partially embedded in the core.

Example 33 includes the subject matter of Example 32, and further specifies that the inductor includes a solenoid and a magnetic material proximate to the solenoid.

Example 34 includes the subject matter of Example 33, and further specifies that the solenoid includes a stack of multiple conductive vias in the core.

Example 35 includes the subject matter of Example 33, and further specifies that the solenoid includes a via that extends from one face of the core to an other face of the core.

Example 36 includes the subject matter of any of Examples 28-35, and further specifies that the IC package support is a package substrate or an interposer.

Example 37 is a method of manufacturing an electronic device, including: forming an assembly by attaching a die to a face of an IC package support, wherein the IC package support includes a core between two buildup regions, the two buildup regions have different thicknesses; and attaching a thermal management device to the assembly.

Example 38 includes the subject matter of Example 37, and further specifies that the thermal management device includes a heat sink or a heat spreader.

Example 39 includes the subject matter of any of Examples 37-38, and further specifies that one of the two buildup regions is thicker than the other buildup region, and the die is attached to conductive contacts of the thicker buildup region.

Example 40 includes the subject matter of any of Examples 37-39, and further specifies that the IC package support and the die are part of an IC package, and the method further includes: attaching the IC package to a circuit board.

Example 41 includes the subject matter of any of Examples 37-40, and further specifies that the IC package support includes an inductor at least partially in the core.

Example 42 includes the subject matter of Example 41, and further specifies that the inductor includes a solenoid and a magnetic material proximate to the solenoid.

Example 43 includes the subject matter of Example 42, and further specifies that the magnetic material includes an epoxy resin.

Example 44 is a computing device, including: a circuit board; and an integrated circuit (IC) package coupled to the circuit board, wherein the IC package includes an IC package support and a computing component coupled to the IC package support, and the IC package support includes: a core having a first face and an opposing second face, a first buildup region at the first face of the core, and a second buildup region at the second face of the core; wherein a thickness of the first buildup region is different than a thickness of the second buildup region.

Example 45 includes the subject matter of Example 44, and further specifies that the circuit board is a motherboard.

Example 46 includes the subject matter of any of Examples 44-45, and further specifies that the computing device is a handheld computing device or a server computing device.

Example 47 includes the subject matter of any of Examples 44-46, and further specifies that the IC package support includes an inductor at least partially in the core.

Example 48 includes the subject matter of Example 47, and further specifies that the inductor includes magnetic material interior to a solenoid and exterior to the solenoid.

The invention claimed is:
1. An integrated circuit (IC) package support, comprising:
a core region having a first face and an opposing second face and comprising an inductor between the first face and the second face;
a first buildup region at the first face of the core region; and a second buildup region at the second face of the core region, wherein:
    a thickness of the first buildup region is different than a thickness of the second buildup region,
    the inductor comprises a central solenoid surrounded laterally by a magnetic material,
    the first buildup region comprises a first number of layers of a dielectric material,
    the second buildup region comprises a second number of layers of the dielectric material, and
    the first number is different than the second number.

2. The IC package support of claim 1, wherein:
the core region includes a first dielectric material,
the dielectric material of the first buildup region is a second dielectric material, and
the first dielectric material has a different material composition than a material composition of the second dielectric material.

3. The IC package support of claim 2, wherein the first dielectric material includes glass.

4. The IC package support of claim 2, wherein the first dielectric material includes a prepreg fiber glass material.

5. The IC package support of claim 2, wherein the second dielectric material includes a resin.

6. The IC package support of claim 1, further comprising:
conductive contacts for first-level interconnects at a face of the first buildup region; and
conductive contacts for second-level interconnects at a face of the second buildup region.

7. The IC package support of claim 1, wherein the solenoid comprises stacks of conductive vias in another dielectric material.

8. The IC package support of claim 1, wherein the core region includes a first core region and a second core region, the second core region is between the first core region and the second buildup region, and the first core region is symmetric about a plane parallel to the first face and the second face.

9. The IC package support of claim 8, wherein the second core region includes one or more layers of a prepreg fiber glass material.

10. The IC package support of claim 1, wherein the IC package support is a package substrate or an interposer.

11. The IC package support of claim 1, wherein the core region has a thickness between 100 microns and 1000 microns.

12. An integrated circuit (IC) package, comprising:
an IC package support having a core, wherein:
    the IC package support includes a first buildup region including a first number of buildup layers of a dielectric material at one face of the core,
    the IC package support includes a second buildup region including a second number of buildup layers of the dielectric material at an opposite face of the core, and
    the first number is different than the second number,
    the core comprises an inductor between the one face and the opposite face, and
    the inductor comprises a central solenoid surrounded laterally by a magnetic material; and
a die coupled to the IC package support.

13. The IC package of claim 12, wherein the die includes a processing device.

14. The IC package of claim 12, wherein the inductor is at least partially embedded in the core.

15. The IC package of claim 14, wherein the inductor includes the solenoid and the magnetic material proximate to the solenoid.

16. The IC package of claim 15, wherein the solenoid includes a stack of multiple conductive vias in the core.

17. The IC package of claim 15, wherein the solenoid includes a via that extends from one face of the core to another face of the core.

18. The IC package of claim 12, wherein the IC package support is a package substrate or an interposer.

19. A method of manufacturing an electronic device, comprising:
forming an assembly by attaching a die to a face of an IC package support, wherein:
    the IC package support includes a core between a first buildup region and a second buildup region,
    the core includes an inductor between the first buildup region and the second buildup region,
    the inductor comprises a central solenoid surrounded laterally by a magnetic material,
    the first buildup region and the second buildup region have different thicknesses,
    the first buildup region comprises a first number of layers of a dielectric material,
    the second buildup region comprises a second number of layers of the dielectric material, and
    the first number is different than the second number; and
attaching a thermal management device to the assembly.

20. The method of claim 19, wherein the thermal management device includes a heat sink or a heat spreader.

21. The method of claim 19, wherein one of the first buildup region and the second buildup region is thicker than the other of the first buildup region and the second buildup region, and the die is attached to conductive contacts of the thicker buildup region.

22. A computing device, comprising:
a circuit board; and
an integrated circuit (IC) package coupled to the circuit board, wherein the IC package includes an IC package support and a computing component coupled to the IC package support, and the IC package support includes:
    a core having a first face and an opposing second face, an inductor between the first face and the second face, a first buildup region at the first face of the core, and a second buildup region at the second face of the core, wherein:
    the inductor comprises a central solenoid surrounded laterally by a magnetic material,
    a thickness of the first buildup region is different than a thickness of the second buildup region,
    the first buildup region comprises a first number of layers of a dielectric material,
    the second buildup region comprises a second number of layers of the dielectric material, and
    the first number is different than the second number.

23. The computing device of claim 22, wherein the circuit board is a motherboard.

24. The computing device of claim 22, wherein the computing device is a handheld computing device or a server computing device.

\* \* \* \* \*